(12) United States Patent
Igarashi et al.

(10) Patent No.: US 7,013,444 B2
(45) Date of Patent: Mar. 14, 2006

(54) LAYOUT DESIGN SYSTEM, LAYOUT DESIGN METHOD AND LAYOUT DESIGN PROGRAM OF SEMICONDUCTOR INTEGRATED CIRCUIT, AND METHOD OF MANUFACTURING THE SAME

(75) Inventors: Mutsunori Igarashi, Yokohama (JP); Takashi Mitsuhashi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/824,857

(22) Filed: Apr. 14, 2004

(65) Prior Publication Data

US 2004/0199892 A1    Oct. 7, 2004

Related U.S. Application Data

(62) Division of application No. 10/122,402, filed on Apr. 12, 2002, now Pat. No. 6,763,508.

(30) Foreign Application Priority Data

Apr. 13, 2001    (JP)    ............... P2001-115780

(51) Int. Cl.
*G06F 17/50*    (2006.01)
(52) U.S. Cl. .............................. 716/8; 716/9
(58) Field of Classification Search ............... 716/8–15
See application file for complete search history.

(56) References Cited

U.S. PATENT DOCUMENTS

| | | | |
|---|---|---|---|
| 5,745,124 A | | 4/1998 | Parks et al. |
| 5,905,654 A | * | 5/1999 | Tanino et al. .................. 716/9 |
| 6,262,487 B1 | | 7/2001 | Igarashi et al. |
| 6,546,540 B1 | * | 4/2003 | Igarashi et al. ............... 716/13 |
| 6,769,103 B1 | * | 7/2004 | Chevallier et al. ............. 716/5 |
| 6,813,756 B1 | * | 11/2004 | Igarashi et al. ............... 716/14 |

FOREIGN PATENT DOCUMENTS

| | | |
|---|---|---|
| JP | 3-237741 | 10/1991 |
| JP | 6-332987 | 12/1994 |

OTHER PUBLICATIONS

U.S. Appl. No. 09/713,050, filed Nov. 2000, Igarashi et al.

* cited by examiner

*Primary Examiner*—Vuthe Siek
*Assistant Examiner*—Binh Tat
(74) *Attorney, Agent, or Firm*—DLA Piper Rudnick Gray Cary US LLP

(57) ABSTRACT

A layout design system of a semiconductor integrated circuit, comprising: a library information storage unit configured to register a basic via shape list; a technology database storage unit configured to register a list expressing an optimum wire terminating process for each via shape of said basic via shape list registered in said library information storage unit; and a central processing control unit configured to refer to the lists respectively registered in said library information storage unit and said technology database storage unit, select an optimum line processing, and execute a line design.

8 Claims, 35 Drawing Sheets

FIG.9
Terminal processing method
1. Case of rectangular VIA
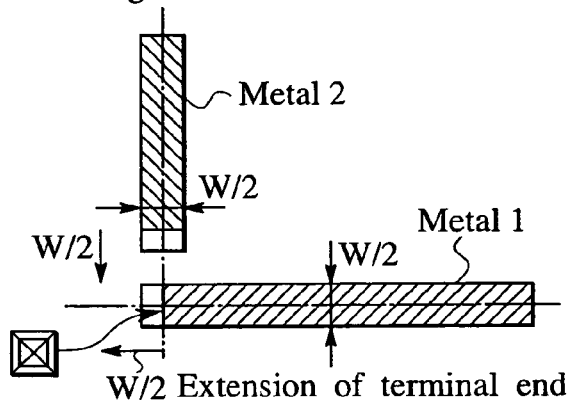
2. Case of lozenge VIA
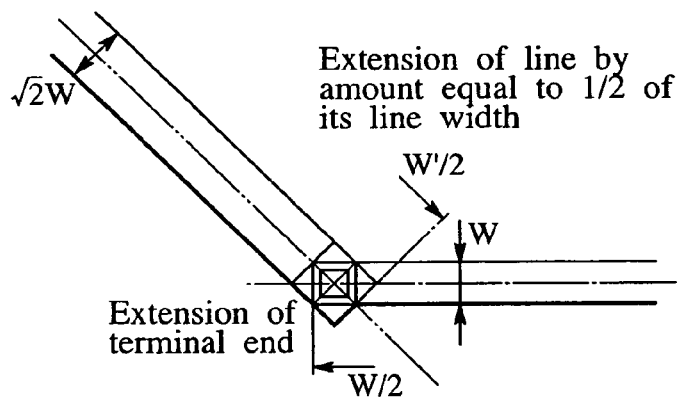
Extension of line by amount equal to 1/2 of its line width
3. Case of octagonal VIA
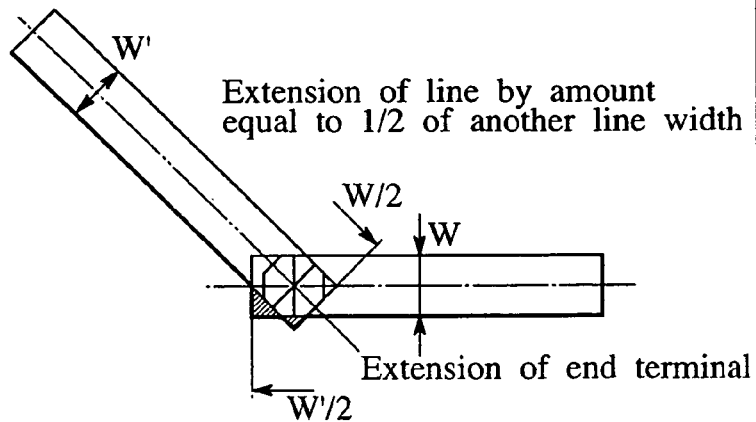
Extension of line by amount equal to 1/2 of another line width
4. Case of parallelogram VIA

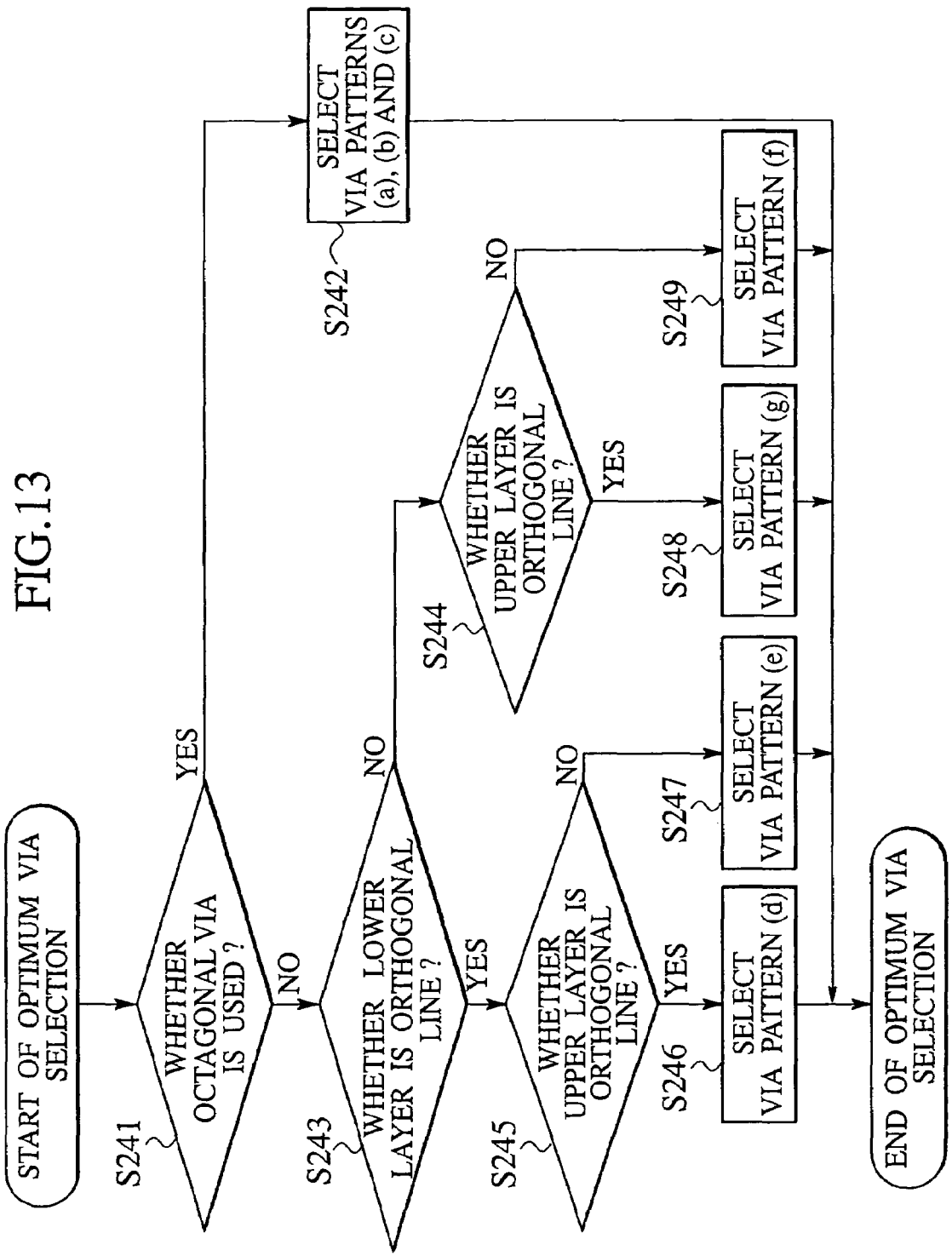

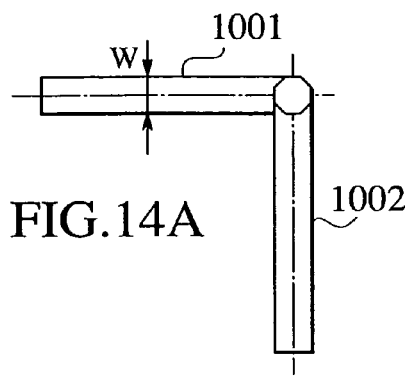
FIG.14A
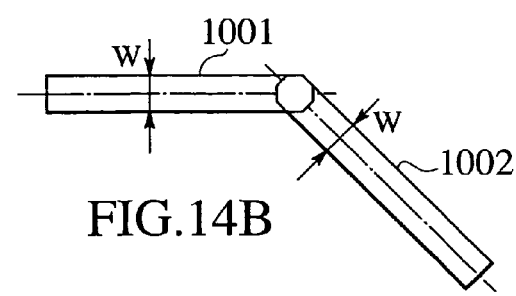
FIG.14B
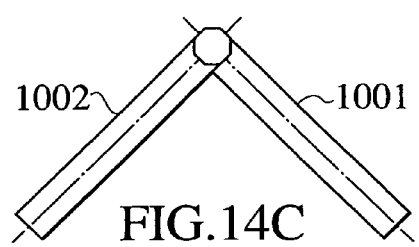
FIG.14C
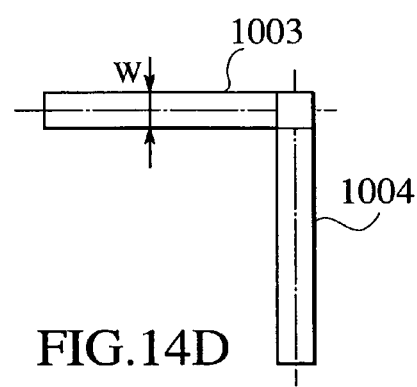
FIG.14D
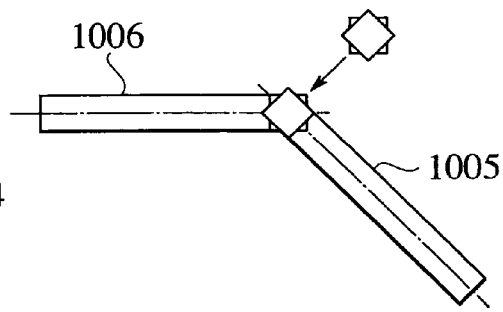
FIG.14E
FIG.14F
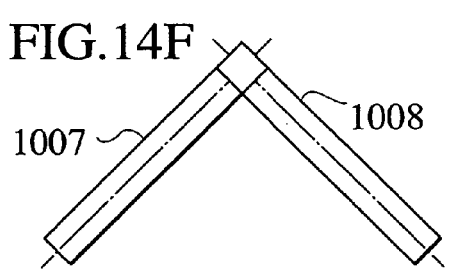
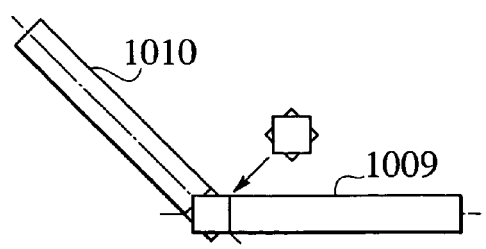
FIG.14G

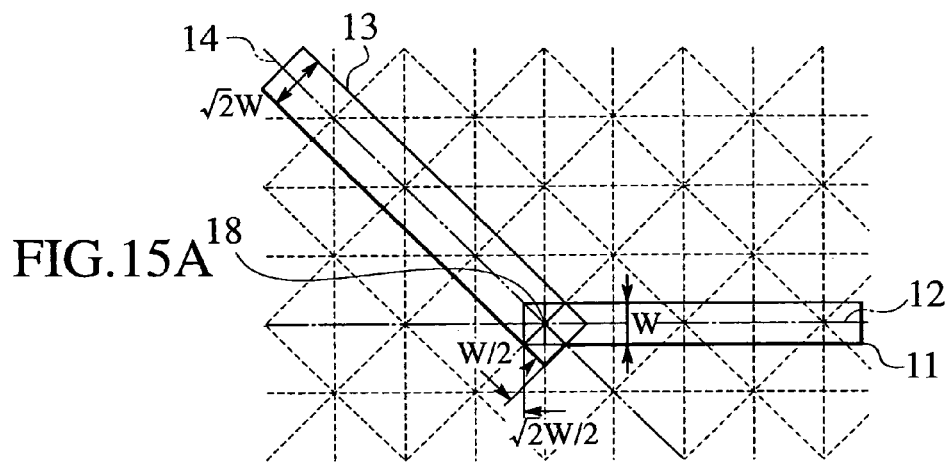
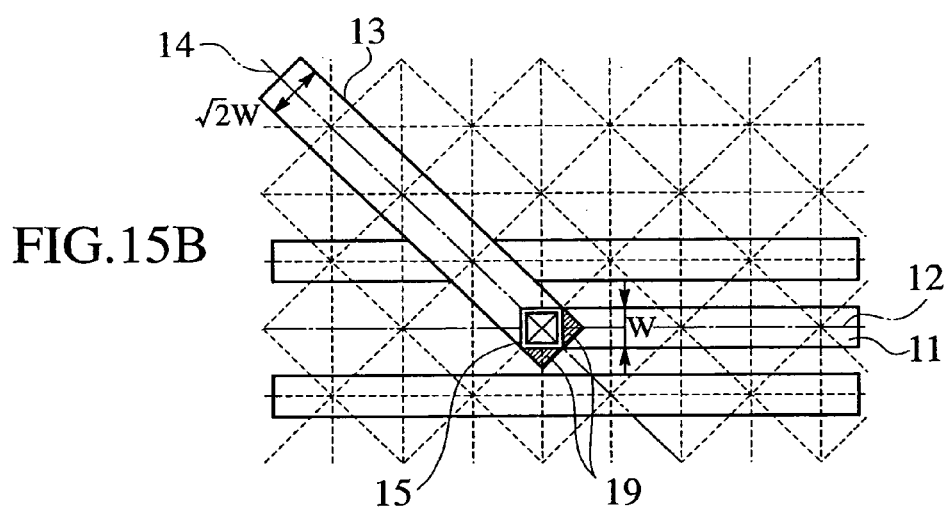
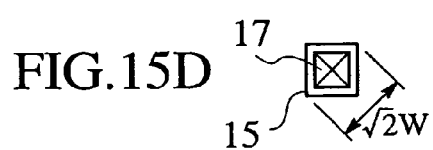
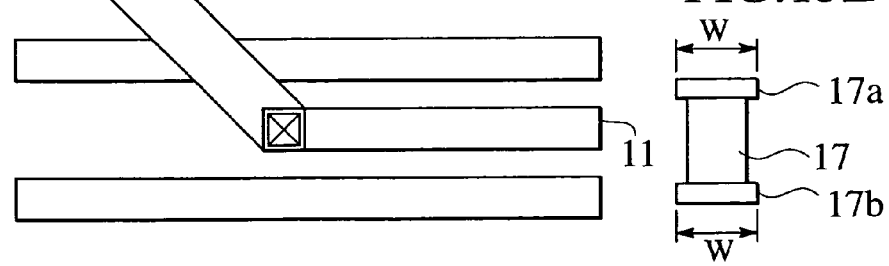

LAYOUT DESIGN SYSTEM, LAYOUT DESIGN METHOD AND LAYOUT DESIGN PROGRAM OF SEMICONDUCTOR INTEGRATED CIRCUIT, AND METHOD OF MANUFACTURING THE SAME

CROSS REFERENCE TO RELATED APPLICATIONS

This application is a divisional application of U.S. patent application Ser. No. 10/122,402 filed on Apr. 12, 2002, now U.S. Pat. No. 6,763,508, which is based on and claims the benefit from prior Japanese Patent Application P2001-115780 filed on Apr. 13, 2001, the disclosure of each is incorporated herein by reference.

BACKGROUND OF THE INVENTION

1. Field of the Invention

The present invention relates to a layout design system of semiconductor integrated circuits facilitating an automatic selection of a wiring pattern by use of CAD, and more particularly to a layout design system of semiconductor integrated circuits for designing a terminal layout of an oblique wiring pattern, a layout design method, and a layout design program. The present invention further relates to a manufacturing method of semiconductor integrated circuits using the layout design system, layout design method and layout design program.

2. Description of the Related Art

Progress of LSI technologies makes the circuit scale larger, and this causes an increase in an amount of logic design computations for the circuit. Accordingly, as a logic design method capable of effectively utilizing computers, a logic design by use of Computer Aided Design (CAD) has been carried out.

In designing interconnection of basic horizontal and vertical lines in the orthogonal coordinate system on CAD, horizontal and vertical lines often terminate at an intersection point of two or more orthogonal lines. When the horizontal lines and the vertical lines are formed in different levels in an actual semiconductor device, a via hole must be formed at the terminal portions of the metal lines to connect the horizontal and vertical lines three-dimensionally. As a matter of course, a connection pattern corresponding to the via hole must be defined at the terminal portions of the horizontal and vertical lines even in a layout by use of CAD.

Generally, if two basic orthogonal lines having an ordinary width W terminate at an intersection, wire terminating process is carried out to extend the ends of the orthogonal lines by W/2.

FIGS. 1A to 1E illustrate an example of the wire terminating process of the basic orthogonal lines of the minimum width. In FIG. 1A, a horizontal line 901 and a vertical line 903 intersect each other and terminate there. In a CAD system, only the intersection point at which the center lines 902 and 904 of the respective lines intersect each other is recognized as an intersection point 908. The CAD system does not recognize the overlap of the two orthogonal lines at all.

When, in an actual semiconductor device, the horizontal line 901 is formed in a lower level and the vertical line 902 is formed in an upper level, these two lines must be connected three-dimensionally by use of a via hole. As a matter of course, the CAD layout requires a connection pattern 905 for connecting the two lines. The connection pattern 905 has a bottom metal 901a, which is a part of the end portion of the line 901 in the lower level, a top metal 903a, which is a part of the end portion of the line 903 in the upper level, and an opening pattern (hereinafter, referred to as a "cut pattern" or simply as a "cut") 907 for connecting the top and bottom metals 903a and 901a.

In the example of FIGS. 1A to 1E, since the CAD recognizes that the two lines intersect each other, it is possible to define the connection pattern 905 at the intersection point 908 on the layout. However, since an overlapped area where the horizontal and vertical lines 901 and 903 overlap is very small in the state of FIG. 1A, even when the via hole is formed based on the connection pattern 905 in the actual semiconductor integrated circuit, the connections of the upper and lower levels and the via hole cannot be achieved successfully.

To overcome this problem, in the design system of the semiconductor integrated circuits, the ends of the horizontal and vertical lines 901 and 903 are respectively extended by W/2, as shown in FIG. 1B, so that the two lines completely overlap at their end portions. Then, wire terminating process is carried out so as to place the connection pattern 905 on the overlapped area, as shown in FIG. 1C.

FIG. 1D illustrates the shape of the connection pattern 905 at the end portion of the basic orthogonal lines at which they intersect each other, when viewed from above. Since the connection pattern 905 is placed on the intersection of the basic orthogonal lines, the connection pattern 905 has a square shape when viewed from above. FIG. 1E is a side view of the shape of the connection pattern 905. The lower metal 901a and the upper metal 903a are connected by the cut 907.

FIG. 2 illustrates another example of wire terminating process of two orthogonal lines having wide widths. In this case, the two wider orthogonal lines intersect and terminate at the intersection point. These wider lines are special lines such as a power source line and a clock line, and subjected to a wire terminating process similarly to general signal lines. A connection pattern 915 is placed on an overlapped area where a wider horizontal line 911 and a wider vertical line 913 intersect. At this time, since the overlapped area is made wider, a plurality of cuts 917 are provided in one connection pattern. Also in this case, both of the horizontal and vertical lines 911 and 913 are extended by W/2, and a metal pattern completely including the connection pattern 915 having the plurality of cuts 917 is placed in the overlapped area.

It is easy for the CAD system to carry out the wire terminating process to design interconnection consisting of only basic orthogonal lines in the horizontal and vertical directions, as in the examples shown in FIGS. 1 and 2.

However, as the configuration of semiconductor integrated circuits is made finer, higher precision is required in every respect including a manufacturing process and components of a semiconductor integrated circuit. Particularly, a delay component caused by an interconnection (or a wiring) significantly affects the performance of the integrated circuit as the integrated circuit is made finer. Therefore, it is an important subject how to reduce such a delay in the integrated circuit.

Most of the delay components of the interconnection are caused by a line resistance. The most effective way to reduce the line resistance is to reduce a line length. Accordingly, it has been proposed to use oblique lines, in addition to the basic orthogonal lines extending in the horizontal and vertical directions, to reduce the distance between two points in a semiconductor circuit. There is also a proposal to design a circuit layout using oblique lines on CAD. In this case, as the lines including the oblique lines are made in the form of multi-level structure composed of a larger number of levels, for example, the shape and the forming process of via holes connecting basic orthogonal lines in a lower level and oblique lines in an upper level must be contrived.

The inventors of the present invention have proposed in U.S. patent application Ser. No. 09/338,593 a technique for greatly reducing a line resistance of oblique lines itself. This is achieved by setting the width and film thickness of the oblique line to $2^{1/2}$ times as large as those of the basic orthogonal lines. In this gazette, a technology for fully securing a cut area by contriving the shape of a via hole connecting metal lines of different levels is also proposed. In order to realize a high-speed operation of an integrated circuit, the inventors also proposed a tree-type clock supply line path comprised of a combination of oblique lines and the basic orthogonal lines. FIG. 3 illustrates a line structure using the oblique lines. As shown in FIG. 3, considered is the line structure having a horizontal first-level metal line 921, a vertical second-level metal line 922, a horizontal third-level metal line 923, an oblique fourth-level metal line 924, and a fifth-level metal line 925 perpendicular to the fourth-level metal line 924. When the first-level metal line 921, the second-level metal line 922 and the third-level metal line 923 have a line width W, respectively, the fourth-level metal line 924 and the fifth-level metal line 925 have a line width of $2^{1/2}$W.

The inventors of the present invention have proposed a wire terminating process method for lines on a layout in U.S. patent application Ser. No. 09/771,050 when oblique lines are used. FIGS. 4A to 4C illustrate the wire terminating process for an oblique line. As shown in FIG. 4A, when a horizontal line 941 of a minimum line width extending in the horizontal direction is generated and an oblique line 943 having a line width $2^{1/2}$ times as wide as that of the horizontal line 941 and extending at an oblique angle relative to the horizontal line 941 is generated, a cut 947 is provided. FIG. 4B is a drawing when the cut 947 is viewed from above, and FIG. 4C is a drawing when the cut 947 is viewed laterally. FIGS. 5A, 5B and 5C illustrate an intersection structure of a line with a minimum line width in the oblique line. As shown in FIG. 5A, when a horizontal line 941 is generated in a lower level and an oblique line 943 is generated in an upper level, a connection pattern (via) 945 is provided. At this time, a wire terminating process so as to delete a metal at a shaded area is carried out. FIG. 5B is a drawing when the connection pattern (via) 945 is viewed from above, and FIG. 5C is a drawing when the connection pattern (via) 945 is viewed laterally. At this time, the connection pattern 945 has an upper metal portion 943a having a parallelogram shape and a lower metal portion 941a having a rectangular shape.

On the other hand, in the line layout system, there has been one basic VIA shape using the line for each technology. Alternatively, a large VIA using one basic VIA shape (for example, a rectangular shape is typical) in plural has been defined or automatically generated.

However, in the line layout method using an oblique line, a wide line space is consumed when a line is bent in the same line level, and hence there has been a problem that a degree of line integration is lowered and a data amount in a mask generation operation increases.

Moreover, in consideration for various line layout methods, the necessity to selectively perform an optional VIA in accordance with a line pattern and to perform a wire terminating process suitable for the respective VIA shapes has been arisen.

SUMMARY OF THE INVENTION

A layout design system of a semiconductor integrated circuit, comprising: a library information storage unit configured to register a basic via shape list; a technology database storage unit configured to register a list expressing an optimum wire terminating process for each via shape of said basic via shape list registered in said library information storage unit; and a central processing control unit configured to refer to the lists respectively registered in said library information storage unit and said technology database storage unit, select an optimum line processing, and execute a line design.

A computer implemented layout design method, comprising: preparing a basic via shape list and registering the basic via shape list in a library information storage unit; referring to said basic via shape list registered in said library information storage unit, preparing a list expressing an optimum wire terminating process for each via shape of said basic via shape list, and registering the list in a technology database storage unit; referring to the list registered in said technology database storage unit, and selecting an optimum line processing to perform the selected line processing; and selecting an optimum via.

A line design program for allowing a computer to execute, comprising: preparing a basic via shape list, and registering the basic via shape list in a library information storage unit; referring to said basic via shape list registered in said library information storage unit, preparing a list expressing an optimum wire terminating process for each via shape of said basic via shape list, and registering the list in a technology database storage unit; referring to the list registered in said technology database storage unit, and selecting an optimum line processing to perform the selected line processing; and selecting an optimum via.

A computer implemented layout design method, comprising: generating a first line having a first line width and extending in a predetermined direction; generating a second line having a second line width, extending in a direction different from said first line, and having its terminal end overlapping a terminal end of said first line; stretching said first line in a longitudinal direction thereof; stretching said second line in a longitudinal direction thereof by a length ½ times as long as the second line width; deleting a projection from the terminal end of said first line and the terminal end of said second line, the projection protruding from an overlapped area where the terminal end of said first line and the terminal end of said second line overlap; and setting a connection pattern having a polygon connecting said first and second lines at an intersection point of a longitudinal center line of said first line and a longitudinal center line of said second line.

A manufacturing method of a semiconductor integrated circuit, comprising: forming a first line extending in a predetermined direction on a semiconductor substrate; forming a level interlayer insulating film on said first line; forming a polygon via hole penetrating through said level interlayer insulating film; forming a connection conductive portion filling said polygon via hole and connecting with said first line; and forming a second line extending at an angle unperpendicularly relative to said first line and having a terminal end connected to said connection conductive portion.

BRIEF DESCRIPTION OF DRAWINGS

FIG. 9 is an example of data of a technology database storage unit in the layout design system of the semiconductor integrated circuit according to the embodiment of the present invention.

FIG. 13 is a flowchart showing an optimized VIA selection module in the layout design system of the semiconductor integrated according to the embodiment of the present invention.

FIGS. 14A to 14G illustrate examples of line processing patterns and VIA styles in the layout design system of the semiconductor integrated circuit according to the embodiment of the present invention.

FIGS. 15A to 15E are drawings for explaining a layout design method according to a first embodiment of the present invention: FIG. 15A and FIG. 15B are plan views of oblique lines and horizontal lines; FIG. 15C illustrates shapes of the oblique line and the horizontal line after a wire terminating process; and FIG. 15D and FIG. 15E are a top view and a sectional view showing a shape of a connection pattern.

FIG. 17A is a plan view of an oblique line and a horizontal line; and FIG. 17B illustrates shapes of the oblique line and the horizontal line after a wire terminating process.

FIG. 18A is a plan view of an oblique line and a horizontal line; and FIG. 18B illustrates shapes of the oblique line and the horizontal line after a wire terminating process.

FIG. 19A is a plan view of an oblique line and a horizontal line; and FIG. 19B illustrates shapes of the oblique line and the horizontal line after a wire terminating process.

FIG. 20A is a plan view of an oblique line and a horizontal line; and FIG. 20B illustrates shapes of the oblique line and the horizontal line after a wire terminating process.

FIGS. 21A and 21B are plan views of an oblique line and a horizontal line; and FIG. 21C illustrates shapes of the oblique line and the horizontal line after a wire terminating process.

FIG. 22A is a plan view of an oblique line and a horizontal line; FIGS. 22B and 22C are a top view and a side view showing a shape of a connection pattern; and FIG. 22D illustrates a shape of the oblique line and the horizontal line after a wire terminating process.

FIG. 23A is a plan view of an oblique line and a horizontal line; FIGS. 23B and 23C are a top view and a side view showing a shape of a connection pattern; and FIG. 23D illustrates a shape of the oblique line and the horizontal line after a wire terminating process.

FIG. 24A is a plan view of an oblique line and a horizontal line; and FIG. 24B illustrates shapes of the oblique line and the horizontal line after a wire terminating process.

FIG. 25A is a plan view of an oblique line and a horizontal line; and FIG. 25B illustrates shapes of the oblique line and the horizontal line after a wire terminating process.

DETAILED DESCRIPTION OF THE INVENTION

Figure 1A:
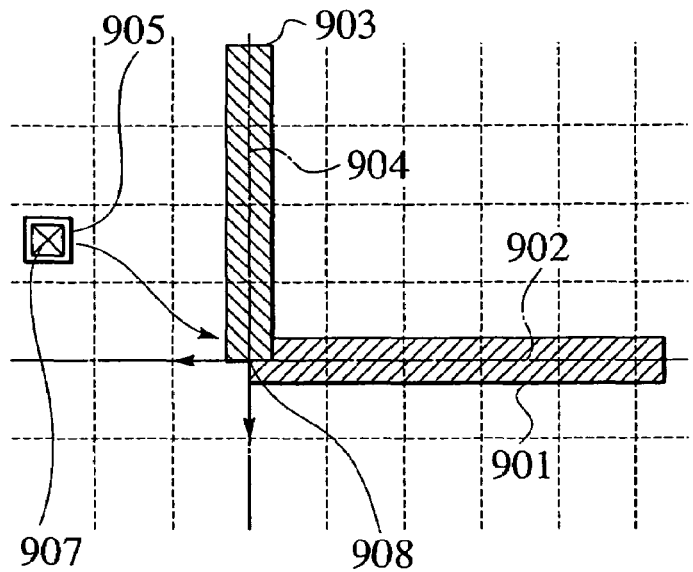
FIGS. 1A to 1E are plan views showing a terminal layout of basic orthogonal lines of a minimum line width, which is produced by a layout design method.
Figure 1D:
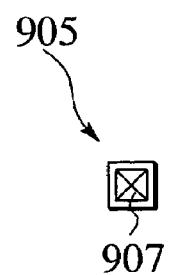
Figure 1E:
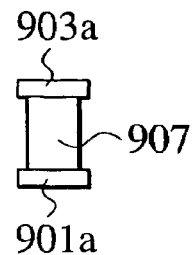
Figure 1B:
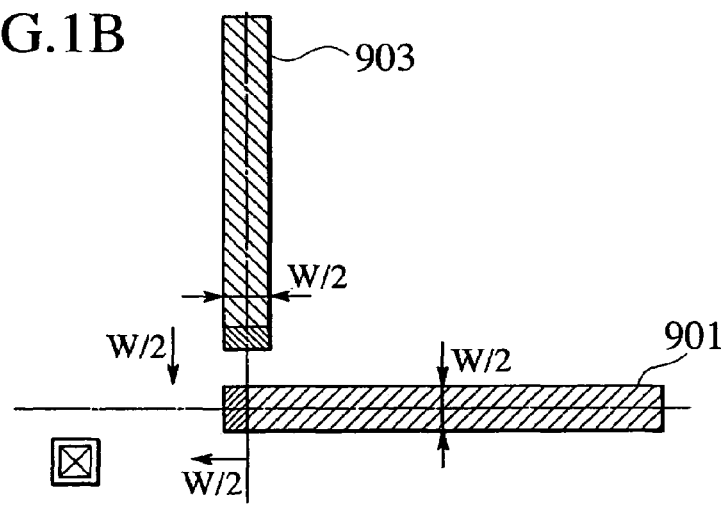
Figure 1C:
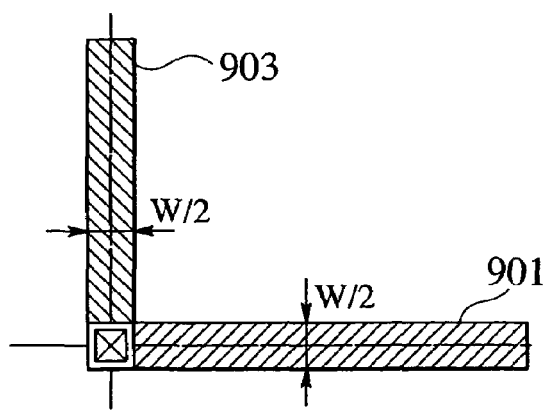
Figure 2:
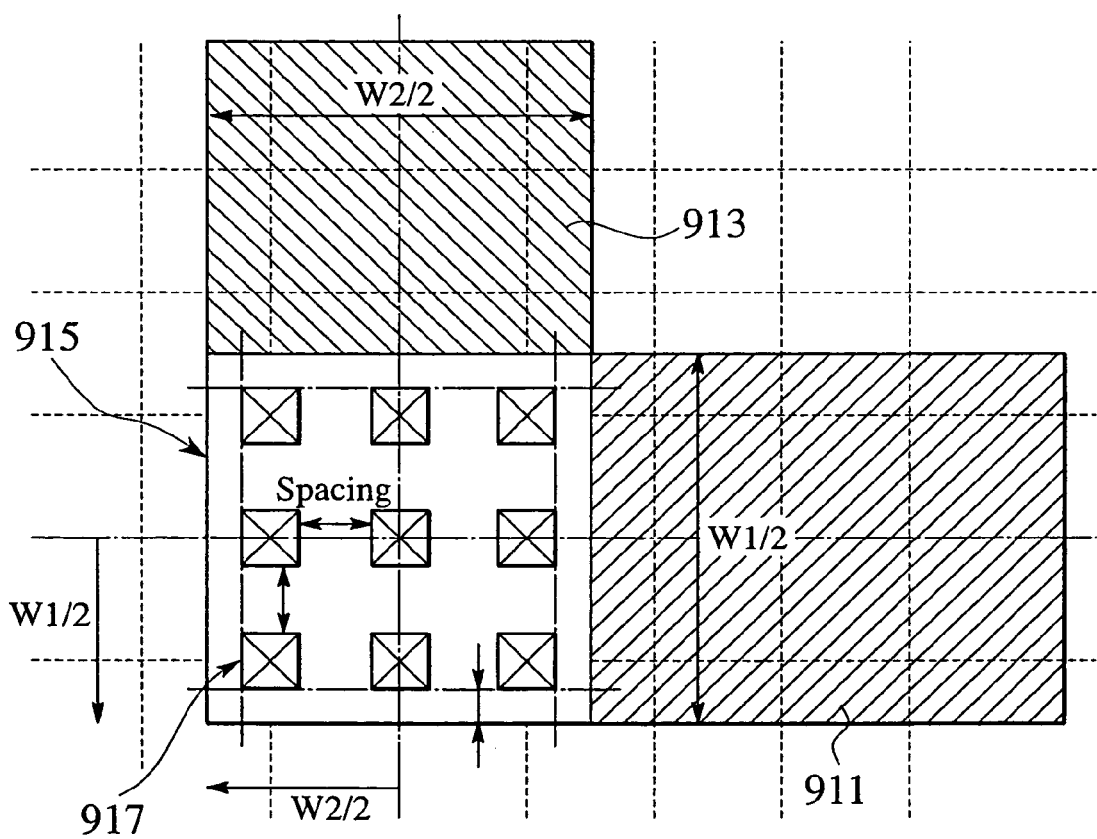
FIG. 2 illustrates a terminal layout of basic orthogonal lines with a wide width produced by the layout design method.
Figure 3:
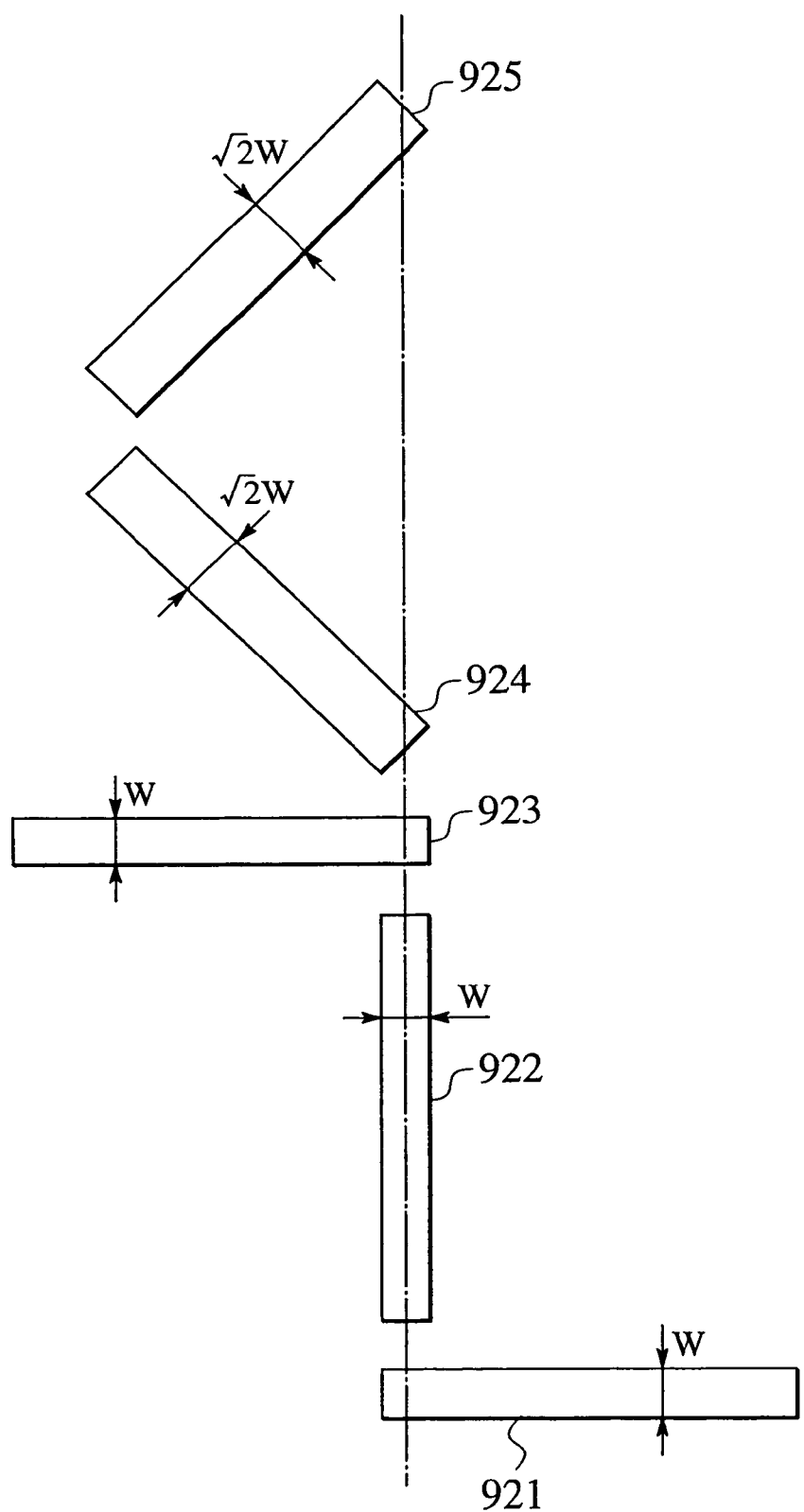
FIG. 3 illustrates a line structure using oblique lines.
Figure 4A:
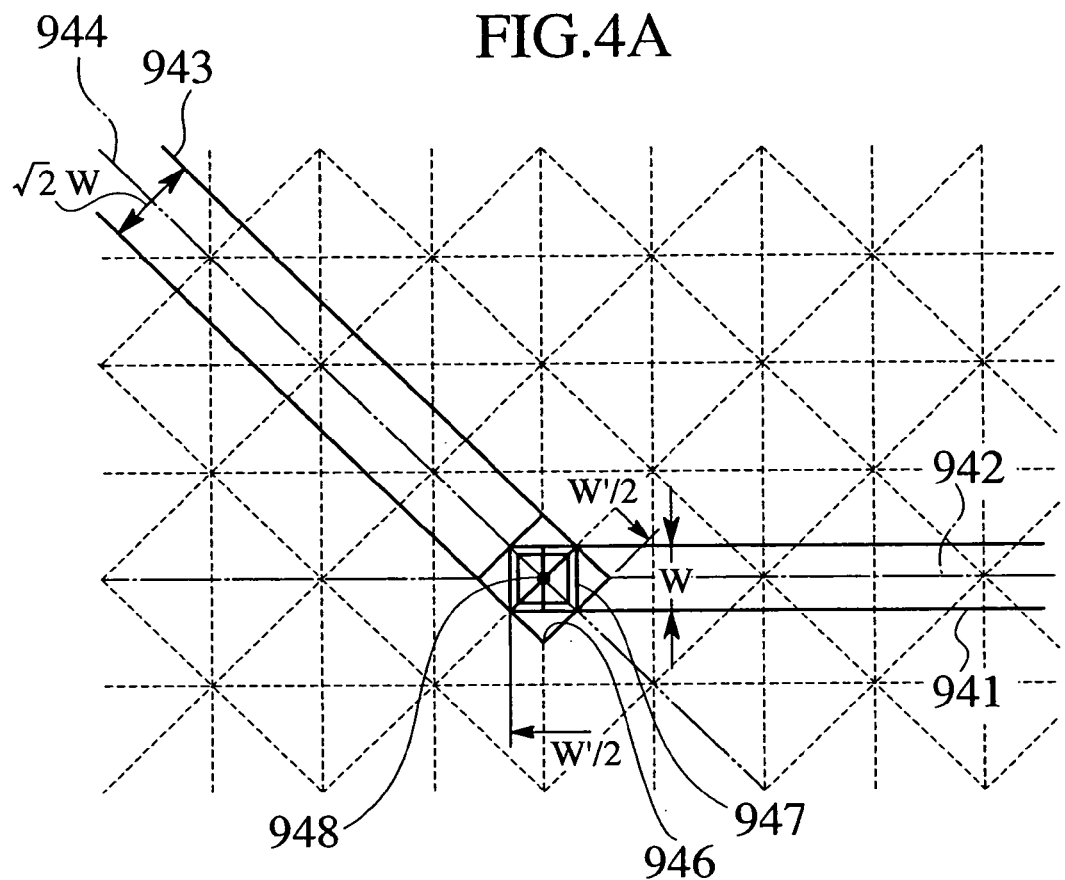
FIGS. 4A to 4C illustrate wire terminating processs of the oblique lines.
Figure 4B:
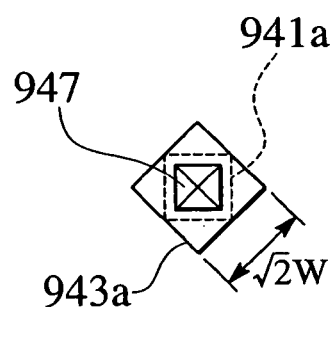
Figure 4C:
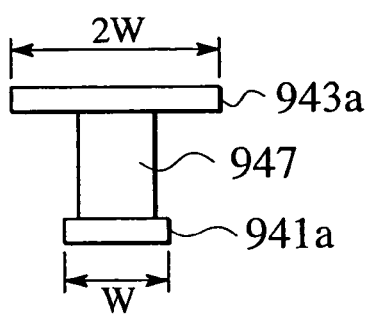
Figure 5A:
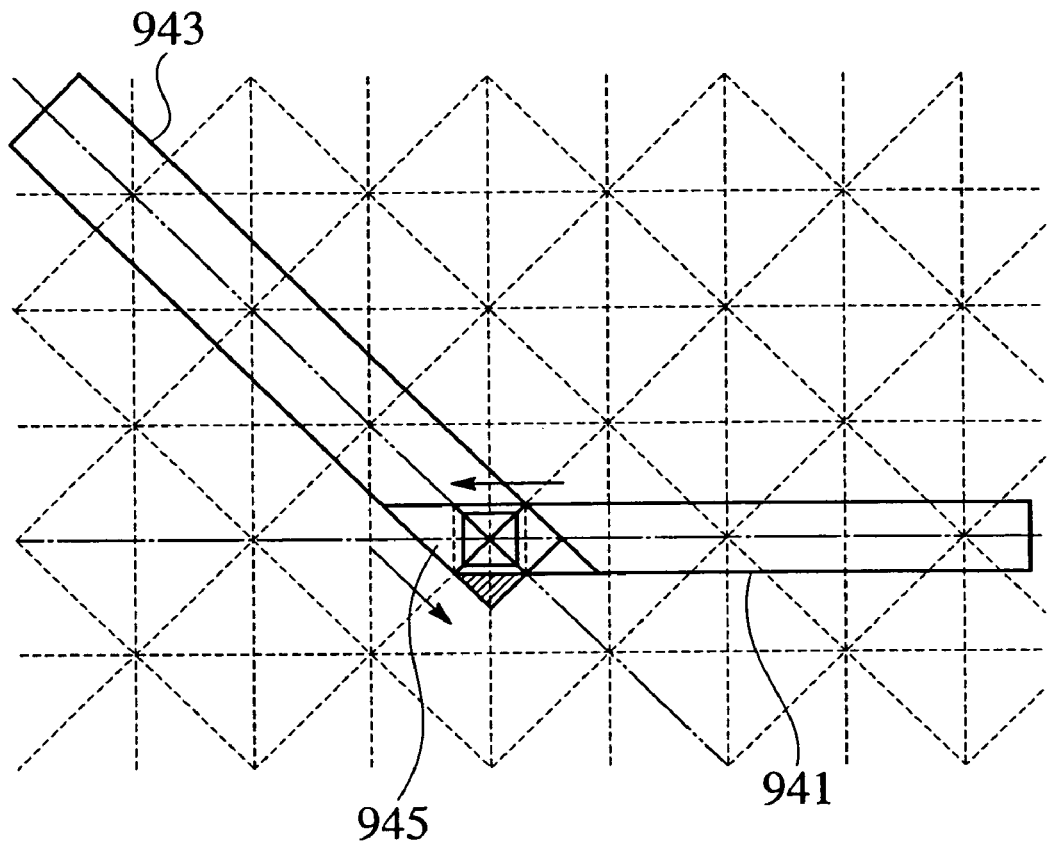
FIGS. 5A to 5C illustrate intersection structures of lines with a minimum line width in the oblique lines.
Figure 5B:
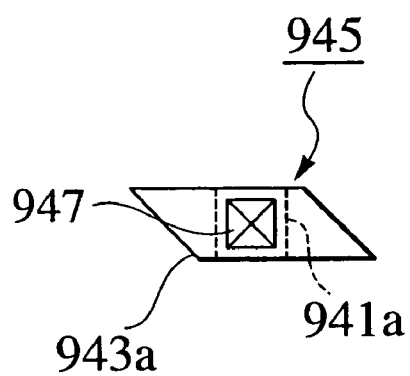
Figure 5C:
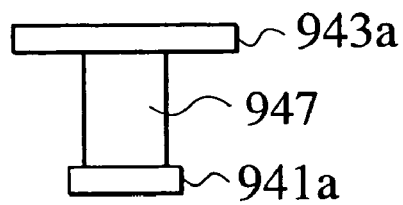

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is in the representation of semiconductor devices, it will be appreciated that the various drawings are not drawn to scale from one figure to another nor inside a given figure, and in particular that the layer thicknesses are arbitrarily drawn for facilitating the reading of the drawings.

In the following descriptions, numerous specific details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

(System Constitution and Embodiment of Processing Contents)

Figure 6:
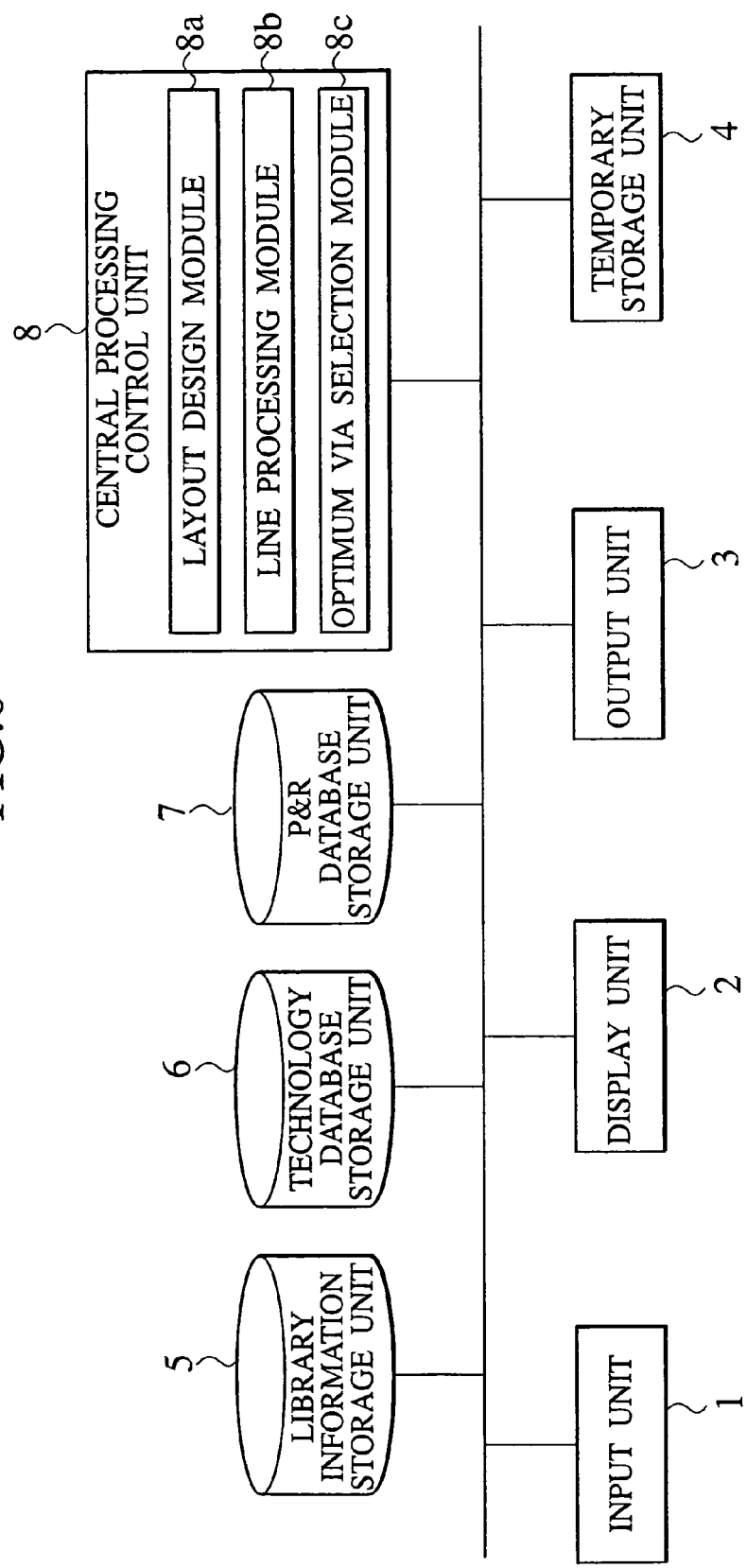
FIG. 6 is a function block diagram of a layout design system of a semiconductor integrated circuit according to an embodiment of the present invention.

The layout design system for the embodiment of the present invention includes an input unit 1, a display unit 2, an output unit 3, a temporary storage unit 4, a library information storage unit 5, a technology database storage unit 6, a Place and Route (P&R: layout) database storage unit 7, and a central processing control unit 8, as shown in FIG. 6.

Figure 8:
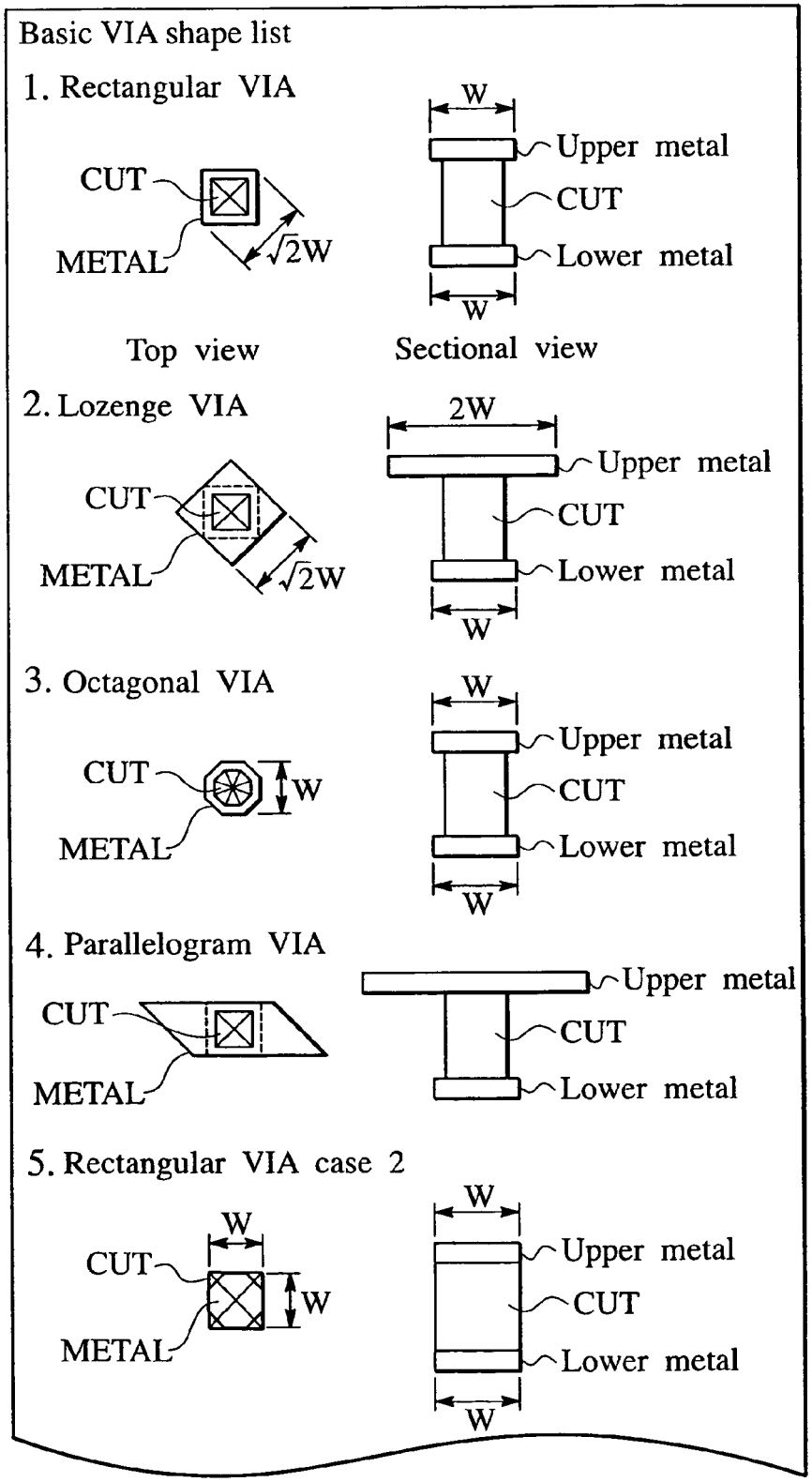
FIG. 8 is an example of data of a library information storage unit in the layout design system of the semiconductor integrated circuit according to the embodiment of the present invention.

In the library information storage unit 5, a basic VIA shape list is registered, which is obtained from a top view and a sectional view of VIA and defines a size and a shape of the VIA. Specifically, data as shown in FIG. 8 is registered in the library information storage unit 5. In the technology database storage unit 6, a layout design method which shows a wire terminating process most suitable for respective VIA shapes and uses these line widths and VIA sizes as parameters is registered in the form of a list. Specifically, data as shown in FIG. 9 is registered. In the P & R database storage unit 7, coordinate data concerning a layout processing is registered.

The central processing control unit 8 executes processings for the layout design system of the semiconductor integrated circuit, and includes a layout design module 8a, a line processing module 8b, and an optimum VIA selection module 8c. The layout design module 8a executes general processings such as a line processing and a layout processing which are executed on CAD, in accordance with information input via the input unit 1. The line processing module 8b is a processing module concerning particularly a line in the layout design module 8a. The line processing module 8b prepares a detailed line route and gives a decision of a design rule violation as to the selected VIA and the wire terminating process. The optimum VIA selection module 8c is a processing module concerning selections of the VIA and the wire terminating process, particularly, and selects the VIA in accordance with line intersection conditions.

The input unit 1 is constituted by a keyboard, a mouse, a voice device and the like, and the display unit 2 is constituted by a liquid crystal display, a CRT display and the like. The output unit 3 is constituted by an ink-jet printer, a laser printer and the like. In the temporary storage unit 4, a ROM and a RAM are incorporated. The ROM functions as a program memory or the like storing a program executed by the central processing control unit 8, and the RAM stores data used when the program is executed in the central processing control unit 8 and functions as a data memory used as a work area.

Although there is no illustration in FIG. 6 for the following module, the central processing control unit 8 also includes a module for controlling the input/output of the input unit 1, the display unit 2, the output unit 3, the temporary storage unit 4, the library information storage unit 5, the technology database storage unit 6, and the P&R database storage unit 7.

Figure 7:
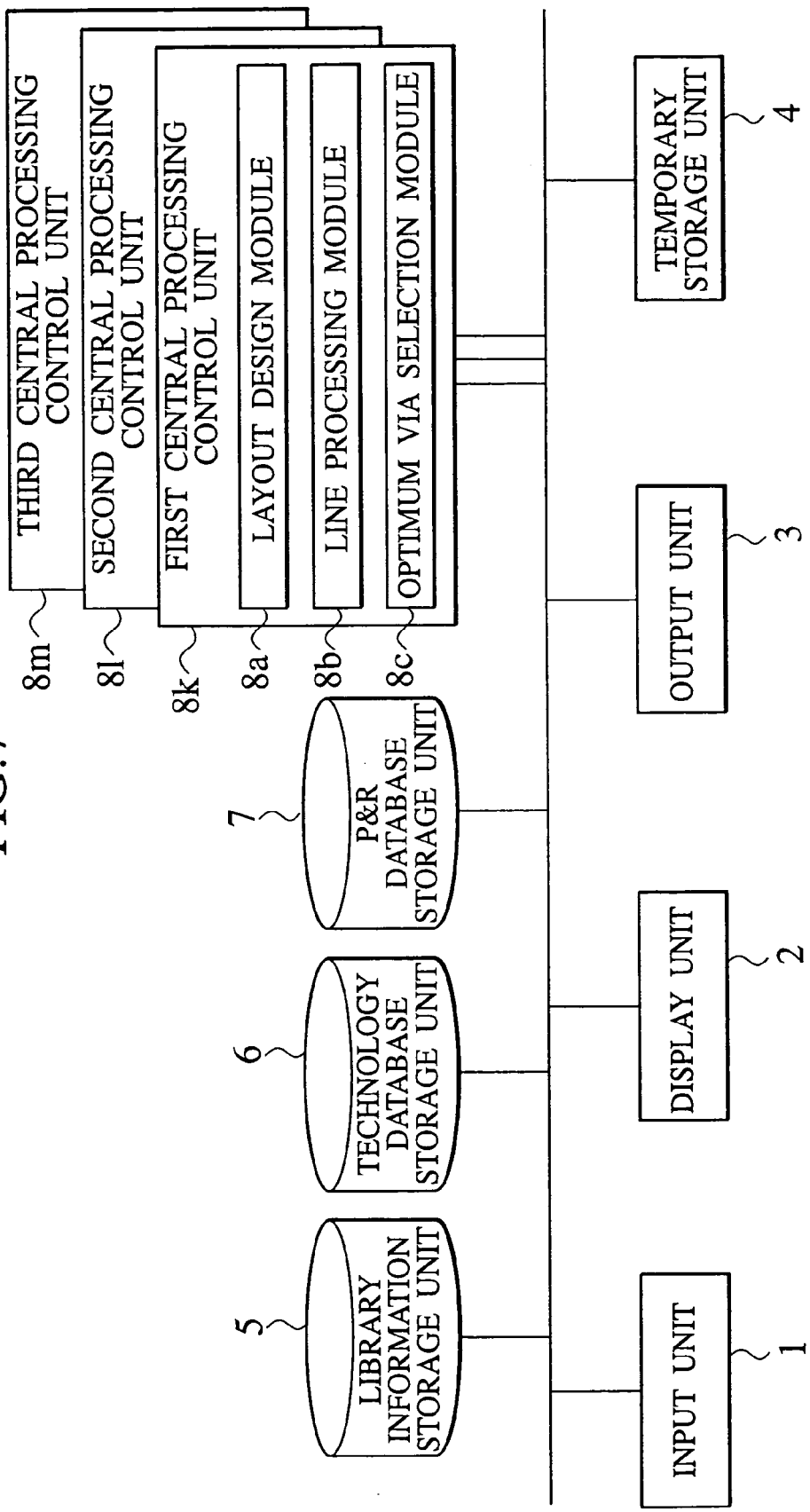
FIG. 7 is a function block diagram of a layout design system of a semiconductor integrated circuit according to the embodiment of the present invention, in which a plurality of central processing control units are provided.

As shown in FIG. 7, the central processing control unit 8 may be a multi-processor system including the plurality of central processing control units such as a first central processing control unit 8k, a second central processing control unit 8l, a third central processing control unit 8m, . . . . In this case, the first to third central processing control units 8k to 8m may include the layout design module 8a, the line processing module 8b, and the optimum VIA selection module 8c, respectively. Alternatively, the respective central processing control units may execute a specified processing module. The layout design system of FIG. 7 can reduce more loads for the central processing control unit than that of FIG. 6, and can execute speedier processings.

A flowchart showing a control style from the outside will be described with reference to FIG. 10. An execution order of respective processings is not limited to the following.

(a) First, in step S101, reading of the library information storage unit 5 and preparation of the technology database storage unit 6 are instructed via the input unit 1. Herein, the layout design system refers to the library information storage unit 5 and acquires a basic VIA shape list.

(b) Furthermore, in step S102, preparation of a pattern of the wire terminating process method prepared in step S101 is instructed via the input unit 1.

(c) Next, in step S103, instruction of a basic VIA library is performed based on the wire terminating process pattern prepared in step S102, and instruction of the wire terminating process method is performed via the input unit 1 in step S104.

(d) Finally, in step S105, referring to the technology database storage unit 6, a layout processing is executed based on the VIA library and the wire terminating process method decided in steps S103 and S104. At this time, data concerning the layout processing is recorded in the P&R database storage unit 7. Moreover, layout pattern data as to the decided layout is output either to the display unit 2 or to the output unit 3.

A flowchart of the layout design module 8a will be described with reference to FIG. 11. An execution order of respective processings is not limited to the following.

Figure 10:
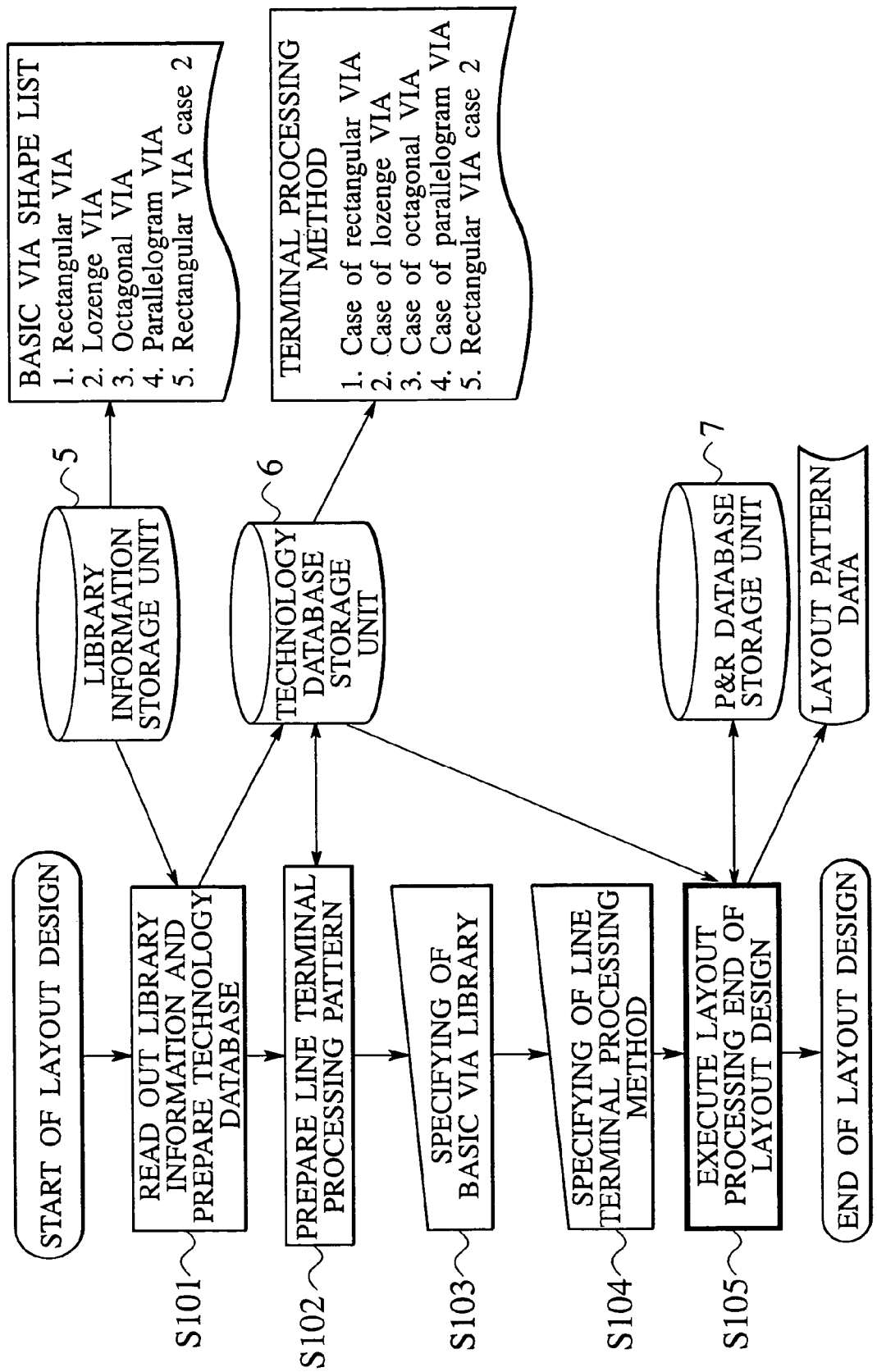
FIG. 10 is a flowchart showing an external control style in the layout design system of the semiconductor integrated circuit according to the embodiment of the present invention.

(a) In step S201, reading of the library information storage unit 5 is performed so as to correspond to step S101 of FIG. 10, and preparation of the technology database storage unit 6 is performed. Herein, library data having various VIA shapes is read, and a suitable layout design method is prepared before execution of an actual line to form the layout design method in the form of a library. At this time, to compress an amount of the library data, the wire terminating process method using the line intersection conditions, the line width, the shape and size of the VIA as parameters is patterned and stored.

(b) Next, a wire terminating process pattern is prepared in step S202 corresponding to step S102.

(c) Next, in step S203, an arrangement processing of an element, a bock and a module is executed, and preparation of an outline line route is performed in step S204.

(d) Further, preparation of a detailed line route and decisions of an optimum VIA and a wire terminating process are performed in step S205 in accordance with the outline route prepared in step S204.

(e) Finally, in step S205, layout pattern data is output as layout results.

Figure 11:
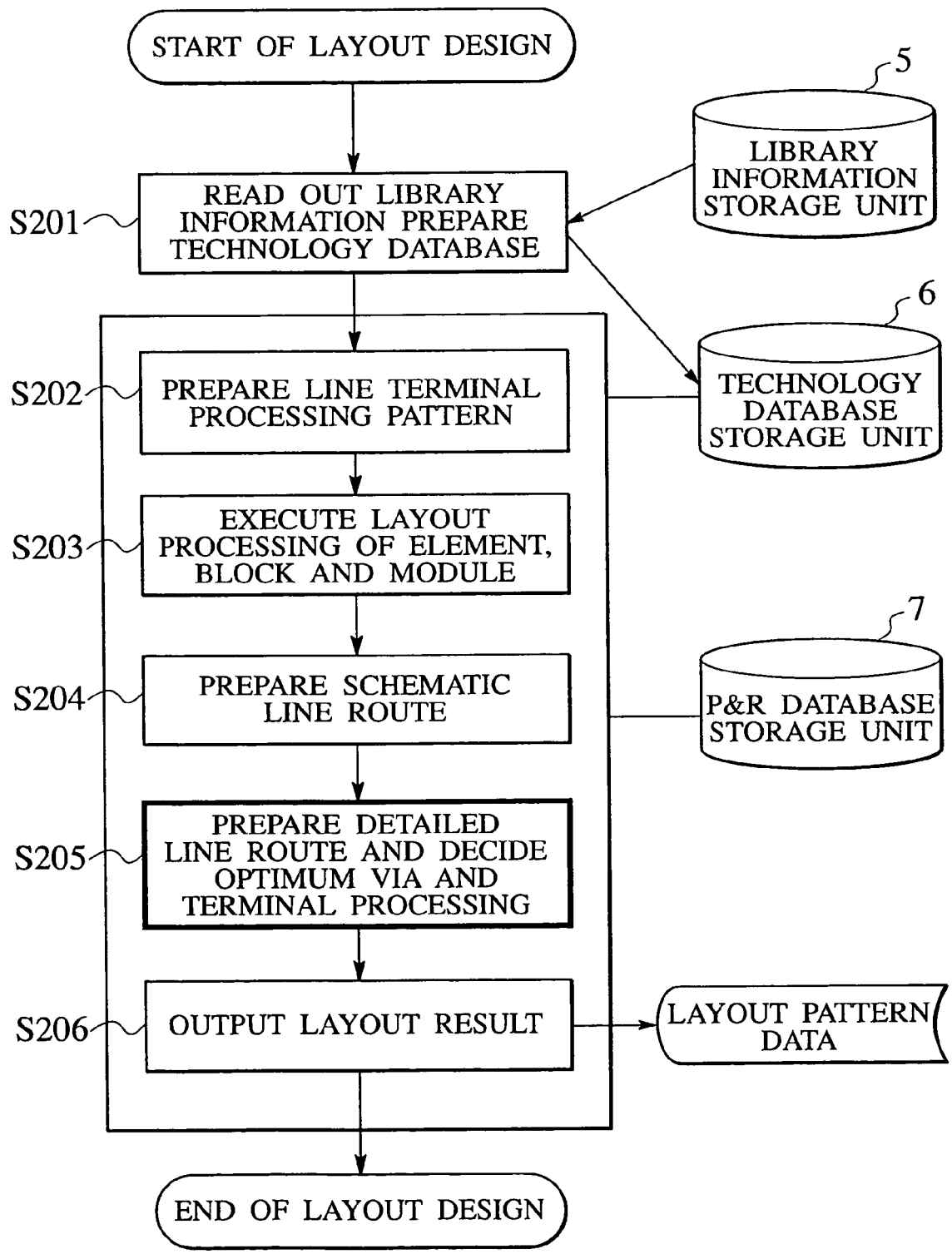
FIG. 11 is a flowchart showing a layout design module in the layout design system of the semiconductor integrated circuit according to the embodiment of the present invention.

In steps S202 to S206 of FIG. 11, the technology database storage unit 6 and the P&R database storage unit 7 are updated at any time.

Figure 12:
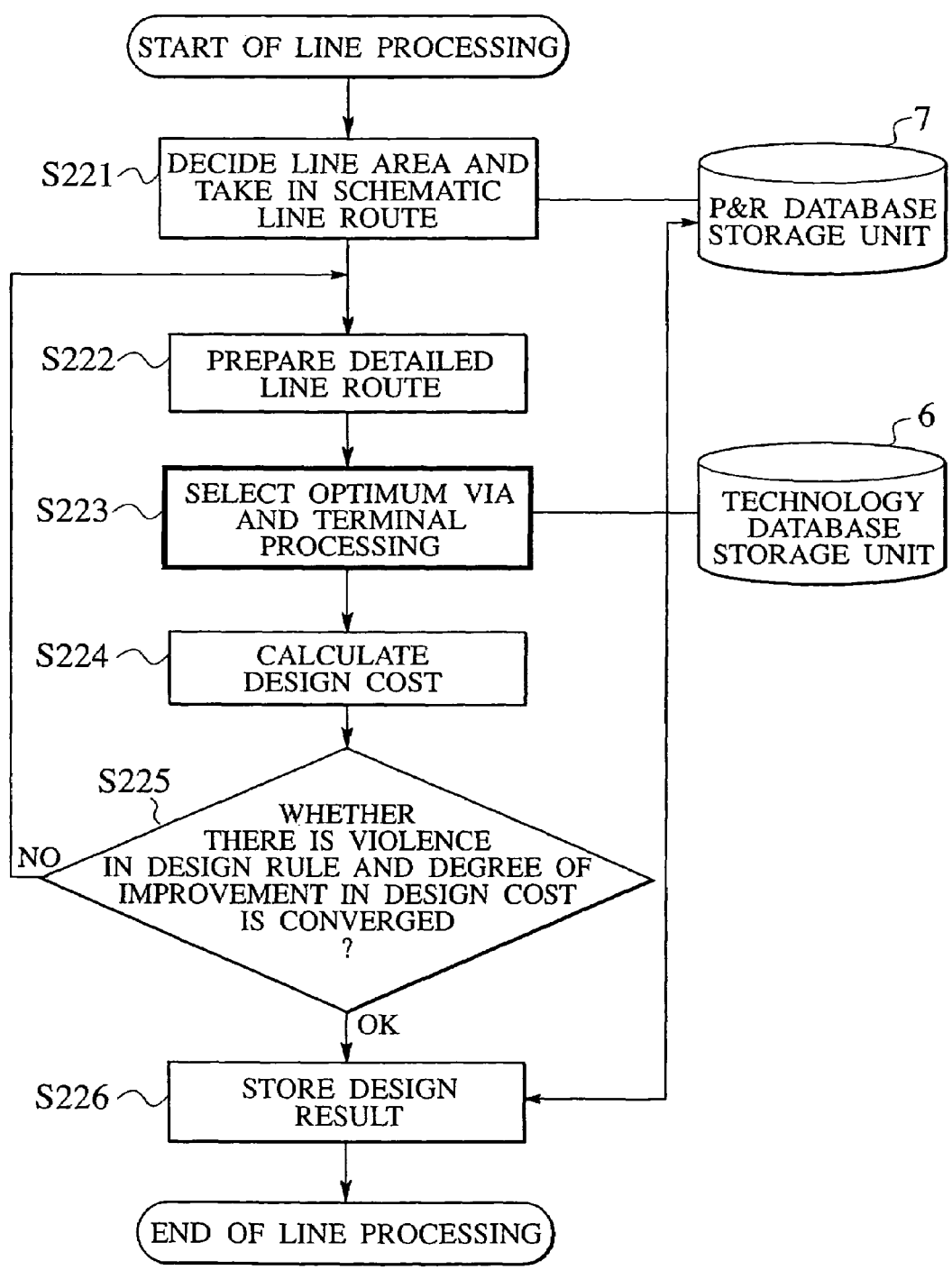
FIG. 12 is a flowchart showing a line processing module in the layout design system of the semiconductor integrated circuit according to the embodiment of the present invention.

A flowchart of the line processing module 8b will be explained with reference to FIG. 12. The processing in the line processing module 8b corresponds to the detailed processing of step S205 of FIG. 11. An execution order of respective processings is not limited to the following.

(a) First, in step S221, a line area is decided with reference to the P&R database storage unit 7, and an outline line route is taken in. In accordance with this, in step S222, preparation of a detailed line route is performed.

(b) Based on the detailed line route obtained in step S222, selections of an optimum VIA and a wire terminating process are carried out in step 223.

(c) Next, in step S224, calculation of a design cost is performed as to the optimum VIA and the wire terminating process that were decided in step S223.

(d) Further, in step S225, a design rule is checked. When there is no violation of the design rule in all connections, a processing for the line area is completed, and a design result is stored in the P&R database storage unit 7 in step S226. When a degree of an improvement in the design cost in the line area is in a conversion state in spite that all of the design rule violations cannot be removed, the processing of the line area is completed, and a design result is stored in the P&R database storage unit 7 in step S226. In step S225, when there is a violation in the design rule and the degree of the improvement in the design cost is not converged, the preparation of the detailed line route is performed again in step S222.

A flowchart of the optimum VIA selection module 8c will be described with reference to FIG. 13. A processing of the optimum VIA selection module 8c corresponds to the detailed processing of step S223 of FIG. 12. An execution order of respective processings is not limited to the following.

FIGS. 14A to 14C illustrate example of using octagonal VIA. FIGS. 14A to 14C are plan view of lower level lines 1001 and upper level lines 1002. FIGS. 14D to 14G illustrate example of using no octaglnal VIA. FIG. 14D illustrates example of using rectangular via for each orthogonal line 1003 and 1004. FIG. 14E illustrates example for case where oblique line 1005 is used for upper level and orthogonal line 1006 is used for lower level. FIG. 14F illustrates example for case where oblique lines 1007 and 1008 is used for upper level. FIG. 14G illustrates example for case where upper level is orthogonal line 1009 and lower level is oblique line 1010.

(a) First, in step S241, it is decided via the input unit 1 whether a VIA applicable to all line directions used, which includes an octagonal VIA, a circular VIA and the like, can be employed. When the lines of 0°, 90°, 45° and 135° series are used and the octagonal VIA can be used, the VIA pattern shown in FIGS. 14A to 14C is selected in step S242, and the procedure is completed. In step S241, when the octagonal VIS is not used, the procedure advances to step S243.

(b) When it is decided that the lower level is an orthogonal line in step S243, and when it is decided that the upper level is an orthogonal line in step S245, a VIA pattern D of FIG. 14D is selected in step S246.

(c) When it is decided that the lower level is an orthogonal line in step S243, and it is decided that the upper level is not an orthogonal line in step S245, a VIA pattern E of FIG. 14E is selected in step S247.

(d) When it is decided that the lower level is not an orthogonal line in step S243, and it is decided that the upper level is not an orthogonal line in step S244, a VIA pattern F of FIG. 14F is selected in step S249.

(e) When it is decided that the lower level is not an orthogonal line in step S243, and it is decided that the upper level is an orthogonal line in step S244, a VIA pattern G of FIG. 14G is selected in step S248.

In this embodiment of the present invention, the line processing can be performed smoothly by preparing the technology database storage unit 6 before the line processing.

In addition, in this embodiment of the present invention, it is decided in the optimum VIA selection module 8c whether the octagonal VIA is used or not. It may be decided prior to the preparation of the line route whether the octagonal VIA is used or not. For example, when the technology database storage unit 6 is prepared in step S201 of FIG. 11, it is possible to allow the technology database storage unit 6 to decide whether the octagonal VIA is used or not. In this case, since the number of the wire terminating process patterns registered in the technology database storage unit 6 can be reduced, the line processing can be performed more smoothly.

As described above, it is possible to provide a layout design system and a layout design method of a semiconductor integrated circuit capable of selecting a line layout method using a VIA having an optional shape speedily and effectively, in an actual line processing in which various line widths and line intersection conditions occur.

Detailed descriptions for the VIA patterns A to G of FIGS. 14A to 14G will be described in first to ninth embodiments of layout design method.

(First Embodiment of Layout Design Method)

In a first embodiment of a layout design method, an embodiment of a layout design method in a case where a rectangular VIA is used in lines formed in different levels will be described.

FIG. 15A is a plan view showing a line layout prepared on CAD by the layout design method according to the first embodiment. First, a horizontal line 11 with a minimum width, which extends horizontally, is generated in a lower level. Subsequently, an oblique line 13 with a line width $2^{1/2}$ times as wide as that of the horizontal line 11, which extends at an oblique angle (an angle of 45° in the first embodiment) relative to the horizontal line 11, is generated in an upper level. As a matter of course, an oblique line 13 extending obliquely at an angle symmetrical to that of FIG. 15A, that is, an angle of 135? relative to the horizontal line 1, may be generated. An intersection point 18 exists at an intersection of a longitudinal center line 12 of the horizontal line 11 and a longitudinal center line 14 of the oblique line 13. An end portion of the horizontal line 11 terminates at a point apart from the intersection point 18 by a length $2^{1/2}/2$ times as long as the line width of the horizontal line 11. An end portion of the oblique line 13 terminates at a point apart from the intersection point 18 by a length ½ times as long as the line width of the horizontal line 11.

A terminal end of the oblique line 13 overlaps a terminal end of the horizontal line 11, and forms an overlapped area. In this overlapped area, a connection pattern (via) 15 for connecting the horizontal and oblique lines 11 and 13 is set at the intersection point 18. This connection pattern is usually called a via (VIA), and corresponds to a via hole of an actual semiconductor integrated circuit.

In the layout design method according to the first embodiment, a deletion of a redundancy portion shown in FIG. 15A is carried out. In other words, as shown in FIG. 15B, the shaded area 19 is deleted in the terminal end of the oblique line 13. Thus, the shape after the wire terminating process can be obtained, as shown in FIG. 15C.

Shapes of an upper level metal 17a and a lower level metal 17b are not limited to the square shape shown in FIG. 15A, and the shapes thereof may be a rectangular shape. A shape in which apexes of the rectangular metal area are coincident with the edges in the longitudinal direction and in the width direction of the horizontal line 11 and the oblique line 13 may be adopted. Otherwise, the metal area may have a fringe wider than the line widths of the horizontal line 11 and the oblique line 13. As shown in FIG. 15A, the upper level metal 17a of the connection pattern 15 uses a square area at the end portion of the oblique line 13, and the lower level metal 17b uses a square area at the end portion of the horizontal line 11. A cut 17 is set at the overlapped area of the upper and lower level metals 17a and 17b.

FIGS. 15D and 15E are a top view and a sectional view which define the shape of the connection pattern 15A with EDA (placement and routing tool). In FIG. 15D, the innermost square with a cross mark in the connection pattern 15 is the cut pattern 17. One side of the connection pattern 15 has a line width equal to that of the horizontal line 11, and a diagonal line thereof has a length $2^{1/2}$ times as long as that of the horizontal line 11. The cut pattern expresses a cut of a via hole in which a high melting point metal such as doped polysilicon, tungsten (W), molybdenum (Mo), titanium (Ti), or a connection conductive metal such as silicide of the above materials ($WSi_2$, $MoSi_2$, $TiSi_2$) is buried to connect the horizontal line 11 and the oblique line 13 in an actual semiconductor integrated circuit. Hereinafter, the cut pattern on the layout is simply referred to as a cut. Moreover, as shown in FIG. 15E, in the lower and upper levels, the connection pattern 15 has metals with a line width equal to that of the horizontal line 11, and the upper and lower level metals 17a and 17b are connected by the cut 17. The cut 17 is completely blocked by the upper level metal 17a. With this constitution, it is possible to prevent the lower level metal 17b from melting during a high temperature processing in an actual processing.

A first feature of the layout design method of the pattern shown in FIGS. 15A to 15E is that the horizontal line 11 and the oblique line 13 overlap fully at their terminal ends, and there is no projection protruding from a contour of each line. Since there is no portion protruding from the contour of each line, an increase in coupling capacitance between the lines adjacent to each other and an adverse influence on a substrate capacitance hardly exist. Moreover, there is no waste of line resources in the oblique line at all. Particularly, as shown in FIG. 15C, a line can be generated close to the horizontal line 11 because of inexistence of the projection.

A second feature of the layout design method of the pattern shown in FIGS. 15A to 15E is that the connection pattern 15 can be formed to be rectangular mainly. Drawing using the orthogonal line on the same mask requires a very small data amount compared to the case where combinations of oblique lines other than the orthogonal lines each intersecting at a right angle, such as a parallelogram and a lozenge, are used.

Furthermore, this layout design method can prevent melting of the lower level metal in the semiconductor integrated circuit to be manufactured. In addition, the oblique line 13 as the upper level and the horizontal line 11 as the lower level are connected to each other securely. Since the oblique line is used, a speed of a signal arrival to a destination point (for example, a flip-flop) can be made faster.

This layout design method further enhances a degree of line integration compared to the wire terminating process method for lines in which the oblique lines are included, and thus it is possible to provide the layout design method capable of reducing a chip size.

(Second Embodiment of Layout Design Method)

In a second embodiment of the layout design method, an embodiment of the layout-design method in which a rectangular VIA is used in lines of different levels and, particularly, an oblique line has a wider width will be described.

A line layout will be described with reference to FIGS. 16A to 16D.

Figure 16A:
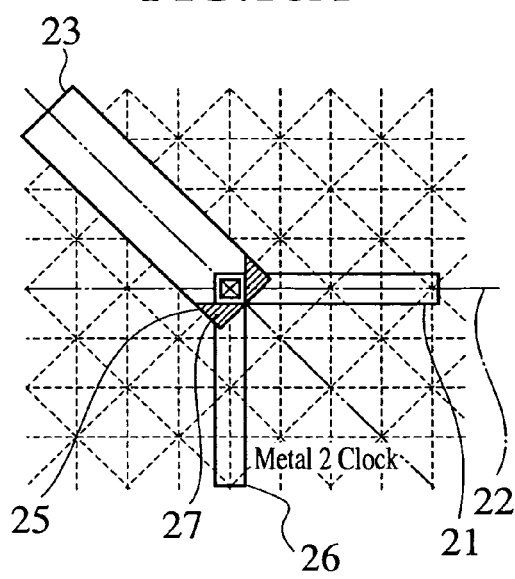
FIGS. 16A to 16D show a line layout formed on CAD by a layout design method according to a second embodiment of the present invention.

As shown in FIG. 16A, a horizontal line 21 extending horizontally (in a third level) and a vertical line 26 perpendicular to the horizontal line 21 are generated in a lower level (a second level). Next, an oblique line 23 with a wider width, which extends obliquely at an angle unperpendicularly relative to the horizontal and vertical lines 21 and 26, is generated in an upper level (a forth level). Terminal ends of the horizontal, vertical and oblique lines 21, 26 and 23 are coincident with each other, and a connection pattern (via) 25 is set at this portion. In this case, the shaded area 27 of the terminal end of the oblique line 23 is deleted, and the connection pattern (via) 25 is set.

Figure 16B:
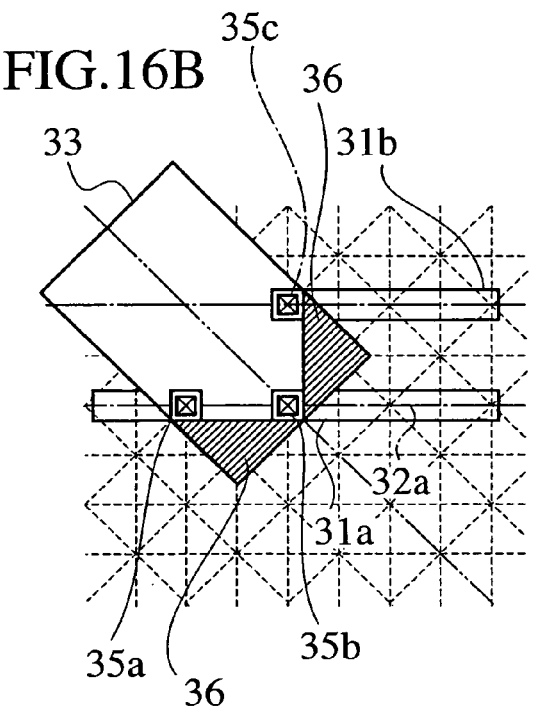

As shown in FIG. 16B, a horizontal line 31a and a horizontal line 31b extending horizontally (in a forth level) are generated in the lower level (a third level). Next, an oblique line 33 with a wider width, which extends obliquely at an angle unperpendicularly relative to the horizontal lines 31a and 31b, is generated in the upper level. In this case, the shaded area 36 at the terminal end of the oblique line 33 is deleted, and a connection pattern (via) 35 is set. In FIG. 16B, the connection patterns (via) 35a and 35b may be set at the portion where the terminal ends of the horizontal line 31a and the oblique line 33 overlap, and the connection pattern (via) 35c may be set at the portion where the terminal ends of the horizontal line 31b and the oblique line 33 overlap.

Figure 16C:
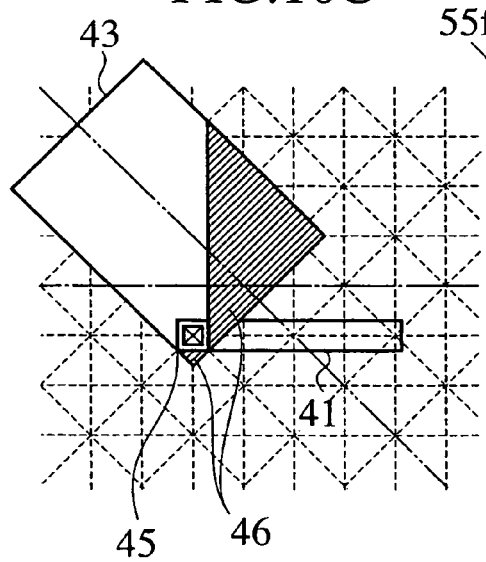

As shown in FIG. 16C, a horizontal line 41 extending horizontally is generated in the lower level. Next, an oblique line 43 with a wider width, which extends obliquely at an angle unperpendicularly relative to the horizontal line 41, is generated in the upper level. The terminal ends of the horizontal line 41 and the oblique line 43 are coincident with each other, and a connection pattern (via) 45 is set at this portion. In this case, the shaded area 46 at the terminal end of the oblique line 43 is deleted, and the connection pattern (via) 45 is set.

Figure 16D:
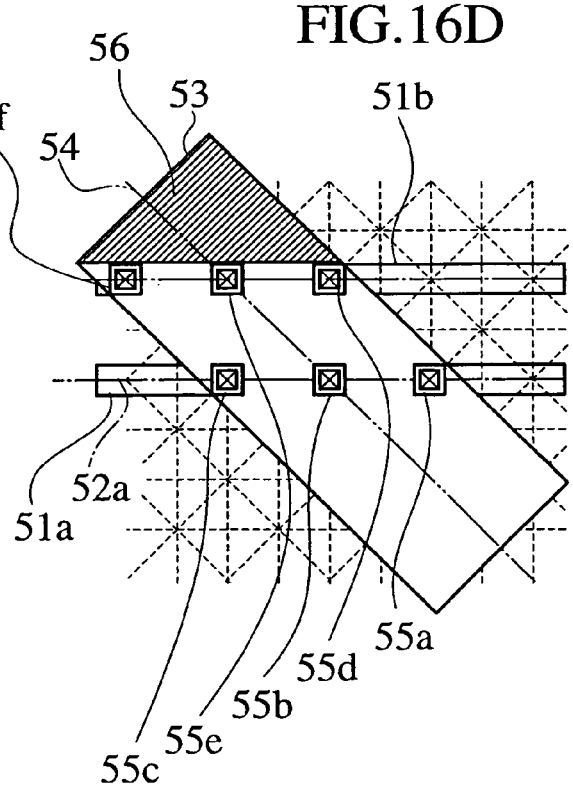

As shown in FIG. 16D, a horizontal line 51a and a horizontal line 51b which extend horizontally (in a forth level) are generated in the lower level (a third level). Next, an oblique line 53 with a wider width, which obliquely extends at an angle unperpendicularly relative to the horizontal lines 51a and 51b, is generated in the upper level. In this case, the shaded area 56 at the terminal end of the oblique line 53 is deleted, and a connection pattern (via) 55 is set. Connection patterns (via) 55a and 55c are set at the portion where the horizontal line 51a and the oblique line 53 overlap, and connection patterns (via) 55d and 55f are set at the portion where the horizontal line 51b and the oblique line 53 overlap. In addition, in accordance with the line width of the oblique line 53, connection patterns (via) 55b and 55e may be set at the portion that is a middle position between the connection patterns (via) 55a and 55c and at the position that is a middle position between the connection patterns (via) 55d and 55f, respectively. In the example of FIG. 16D, though one via is set at the middle position, it is not always necessary to set the via in accordance with the line width of the oblique line 53, and two or more vias may be set.

(Third Embodiment of Layout Design Method)

In a third embodiment of the layout design method, an embodiment of the layout design method in which a rectangular VIA is used for lines formed of the same level, and, particularly, an oblique line has a wide width will be described.

Figure 17A:
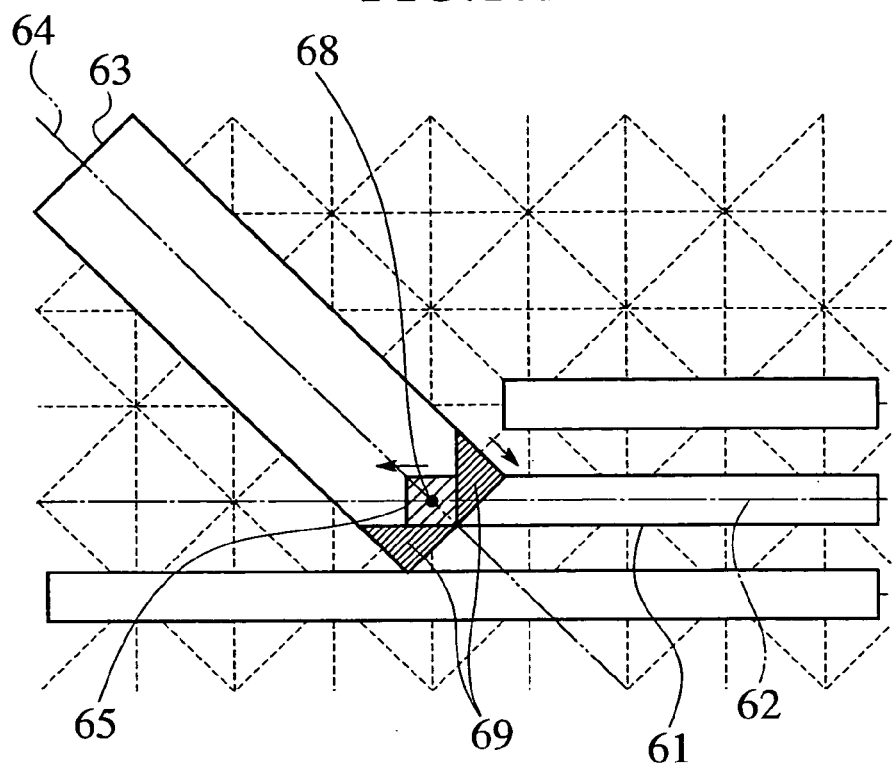
FIGS. 17A and 17B are drawings for explaining a layout design method according to a third embodiment of the present invention.

FIG. 17A is a plan view showing a line layout prepared on CAD by the layout design method according to the third embodiment. First, a horizontal line 61 extending horizontally is generated. Subsequently, an oblique line 63 which has a wider line width than the horizontal line 61 and obliquely extends at an angle unperpendicularly relative to the horizontal line 61 is generated. An intersection point 68 exists at an intersection of a longitudinal center line 62 of the horizontal line 61 and a longitudinal center line 64 of the oblique line 63. An end portion of the horizontal line 61 terminates at a position apart from the intersection point 68 by a length ½ times as long as the line width of the oblique line 63. An end portion of the oblique line 63 terminates at a position apart from the intersection point 68 by a length ½ times as long as the line width of the horizontal line 61. A terminal end of the oblique line 63 overlaps a terminal end of the horizontal line 61, thus forming an overlapped area. In this overlapped area, a turn via 65 connecting the horizontal line 61 and the oblique line 63 is set at the intersection point 68.

In the layout design method according to the third embodiment, a deletion of a redundancy portion is performed. Specifically, as shown in FIG. 17A, the shaded area 69 is deleted in the terminal end of the oblique line 63. Thus, the shape after the wire terminating process is obtained as shown in FIG. 17B.

Figure 17B:
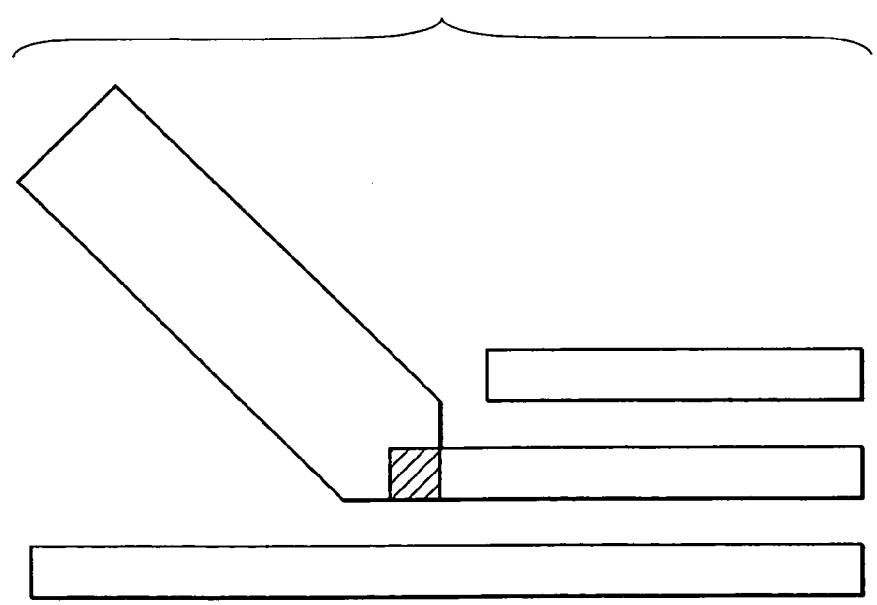

A first feature of the layout design method of the pattern shown in FIGS. 17A and 17B is that the horizontal line 61 and the oblique line 63 fully overlap in their terminal ends, and there is no projection protruding from a contour of each line. Since there is no portion protruding from the contour of each line, an increase in coupling capacitance between the lines adjacent to each other and an adverse influence on a substrate capacitance hardly exist. Moreover, there is no waste of line resources in the oblique line at all. Particularly, as shown in FIG. 17B, a line can be generated close to the horizontal line 61 because of inexistence of the projection.

A second feature of the layout design method of the pattern shown in FIGS. 17A and 17B is that the turn via 65 can be formed to be rectangular mainly. Drawing using the orthogonal line on the same mask requires a very small data amount compared to the case where combinations of oblique lines other than the orthogonal lines each intersecting at a right angle, such as a parallelogram and a lozenge, are used.

As a modification of the third embodiment, an embodiment of the layout design method in which a rectangular VIA is used in lines of the same level and particularly a horizontal line has a wider width will be described.

Figure 18A:
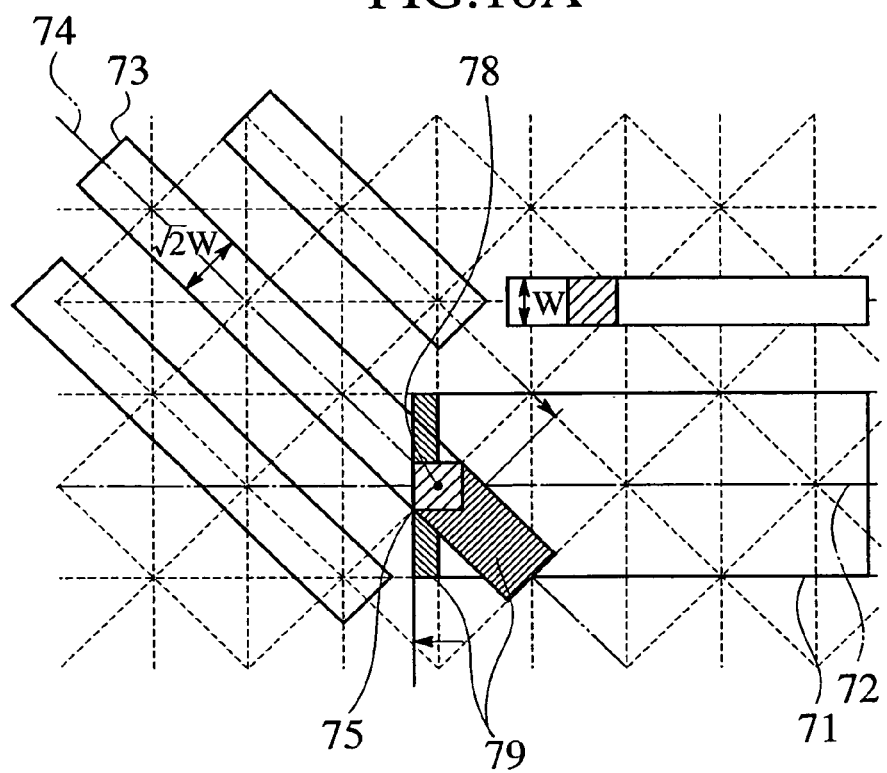
FIGS. 18A and 18B are drawings for explaining a layout design method according to a modification of the third embodiment of the present invention.

FIG. 18A is a plan view showing a line layout prepared on CAD by the layout design method according to the modification of the third embodiment. A horizontal line 71 having a wider line width, which extends horizontally, is generated. Subsequently, an oblique line 73 with a narrower line width compared to the horizontal line 71, which extends obliquely at an angle unperpendicularly relative to the horizontal line 71, is generated. An intersection point 78 exists at an intersection of a longitudinal center line 72 of the horizontal line 71 and a longitudinal center line 74 of the oblique line 73. An end portion of the horizontal line 71 terminates at a position apart from the intersection point 78 by a length ½ times as long as the line width of the oblique line 73. An end portion of the oblique line 73 terminates at a position apart from the intersection point 78 by a length ½ times as long as the line width of the horizontal line 71. A terminal end of the oblique line 73 overlaps a terminal end of the horizontal line 71, and forms an overlapped area. In this overlapped area, a turn via 75 connecting the horizontal line 71 and the oblique line 73 is set at the intersection point 78.

Figure 18B:
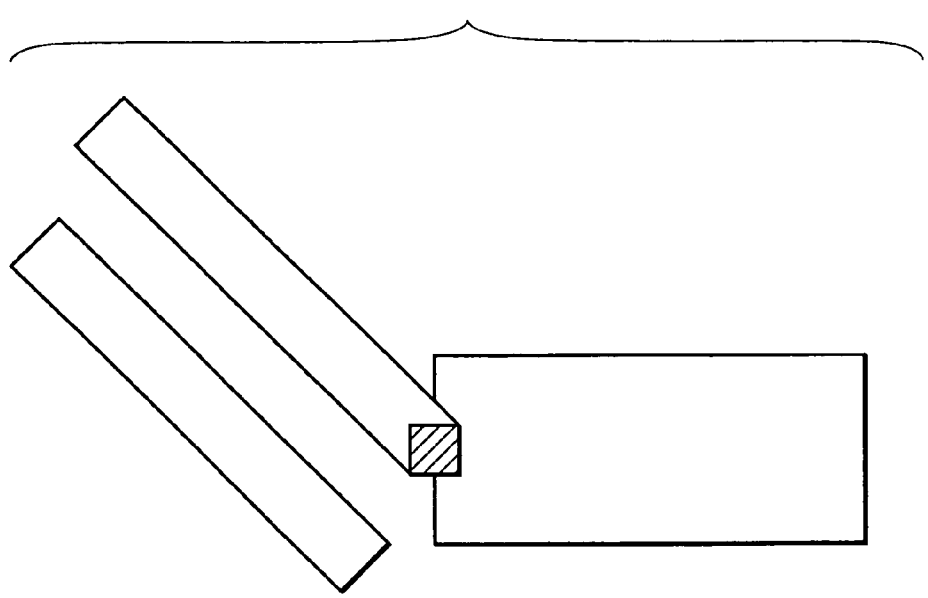

In the modification of the third embodiment, a deletion of a redundancy portion is performed. Specifically, as shown in FIG. 18A, the shaded area 79 is deleted in the terminal end of the horizontal line 71 and the terminal end of the oblique line 73. Thus, the shape after the wire terminating process is obtained as shown in FIG. 18B.

(Fourth Embodiment of Layout Design Method)

In a fourth embodiment of the layout design method, an embodiment of the layout design method in a case of lines in the same level.

Figure 19A:
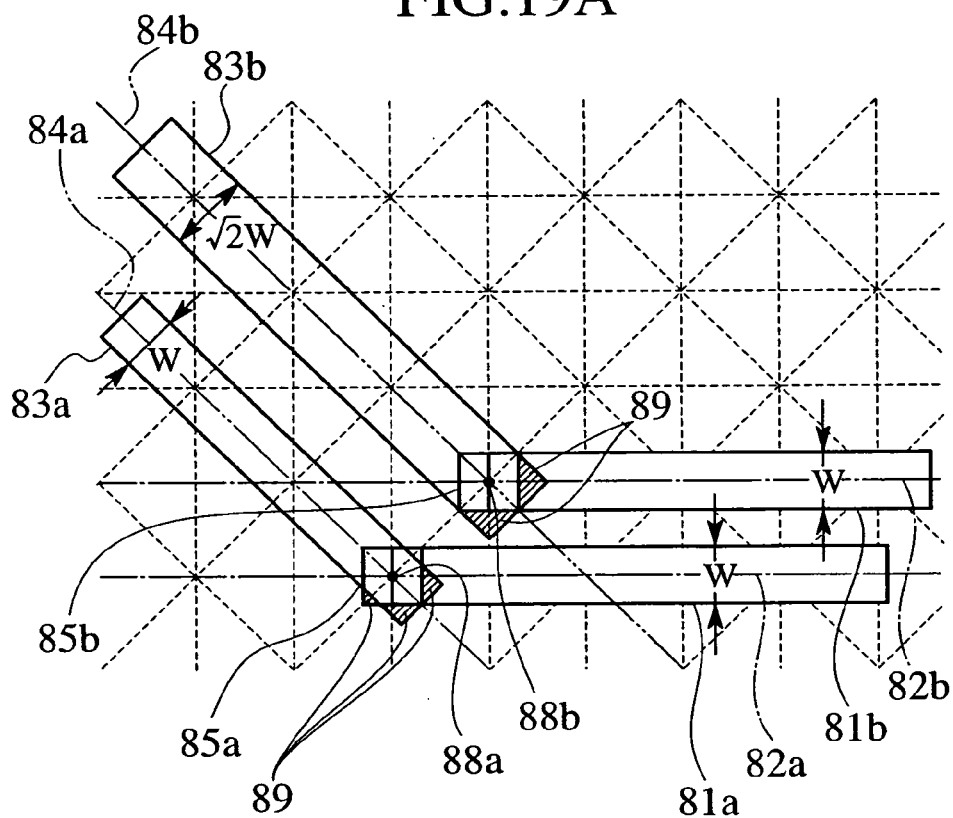
FIGS. 19A and 19B are drawings for explaining a layout design method according to a fourth embodiment of the present invention.

FIG. 19A is a plan view showing a line layout prepared on CAD by the layout design method according to the fourth embodiment. First, a first horizontal line 81a with a minimum line width, which extends horizontally, is generated. Subsequently, a first oblique line 83a with the same line width as that of the first horizontal line 81a, which extends obliquely at an angle unperpendicularly relative to the first horizontal line 81a, is generated. An intersection point 88a exists at an intersection of a longitudinal center line 82a of the first horizontal line 81a and a longitudinal center line 84a of the first oblique line 83a. An end portion of the first horizontal line 81a terminates at a position apart from the intersection point 88a by a length ½ times as long as the line width of the first oblique line 83a. An end portion of the first oblique line 83a terminates at a position apart from the intersection point 88a by a length ½ times as long as the line width of the first horizontal line 81a. A terminal end of the first oblique line 83a overlaps a terminal end of the first horizontal line 81a, and forms an overlapped area. In this overlapped area, a first turn via 85a connecting the first horizontal line 81a and the first oblique line 83a is set at the intersection point 88a. Moreover, the shaded area 89 is deleted in the terminal end of the first horizontal line 81a and the terminal end of the first oblique line 83a.

A second horizontal line 81b with a minimum line width, which extends horizontally, is generated. Subsequently, a second oblique line 83b with a line width $2^{1/2}$ times as long as that of the second horizontal line 81b, which extends obliquely at an angle unperpendicularly relative to the second horizontal line 81b, is generated. An intersection point 88 exists at an intersection of a longitudinal center line 82b of the second horizontal line 81b and a longitudinal center line 84b of the second oblique line 83b. An end portion of the second horizontal line 81b terminates at a position apart from the intersection point 88b by a length ½ times as long as the line width of the second oblique line 83b. An end portion of the second oblique line 83b terminates at a position apart from the intersection point 88b by a length ½ times as long as the line width of the second horizontal line 81b. A terminal end of the second oblique line 83b overlaps a terminal end of the second horizontal line 81b, and forms an overlapped area. In this overlapped area, a second turn via 85b connecting the second horizontal line 81b and the second oblique line 83b is set at the intersection point 88b. Moreover, the shaded area is deleted in the terminal end of the second oblique line 83b.

Figure 19B:
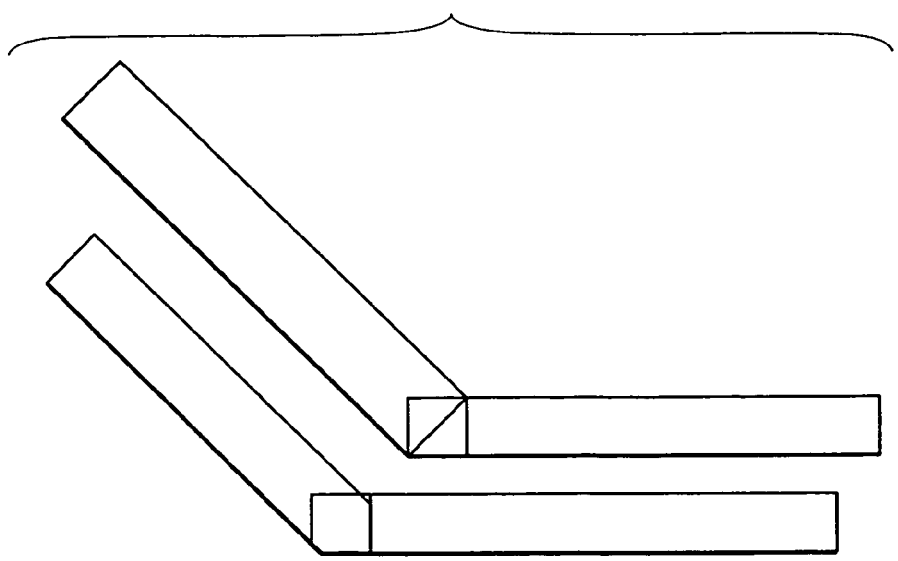

Thus, the shape after the wire terminating process as shown in FIG. 19B is obtained.

A feature of the layout design method of the pattern shown in FIGS. 19A and 19B is that the horizontal lines 81a and 81b and the oblique lines 83a and 83b fully overlap in their terminal ends, and there is no projection protruding from a contour of each line. Since there is no portion protruding from the contour of each line, an increase in coupling capacitance between the lines adjacent to each other and an adverse influence on a substrate capacitance hardly exist. Moreover, there is no waste of line resources in the oblique line at all.

As a modification of the fourth embodiment, an embodiment of the layout design method in which a rectangular VIA is used in lines of the same level and particularly a horizontal line has a wider width will be described.

Figure 20A:
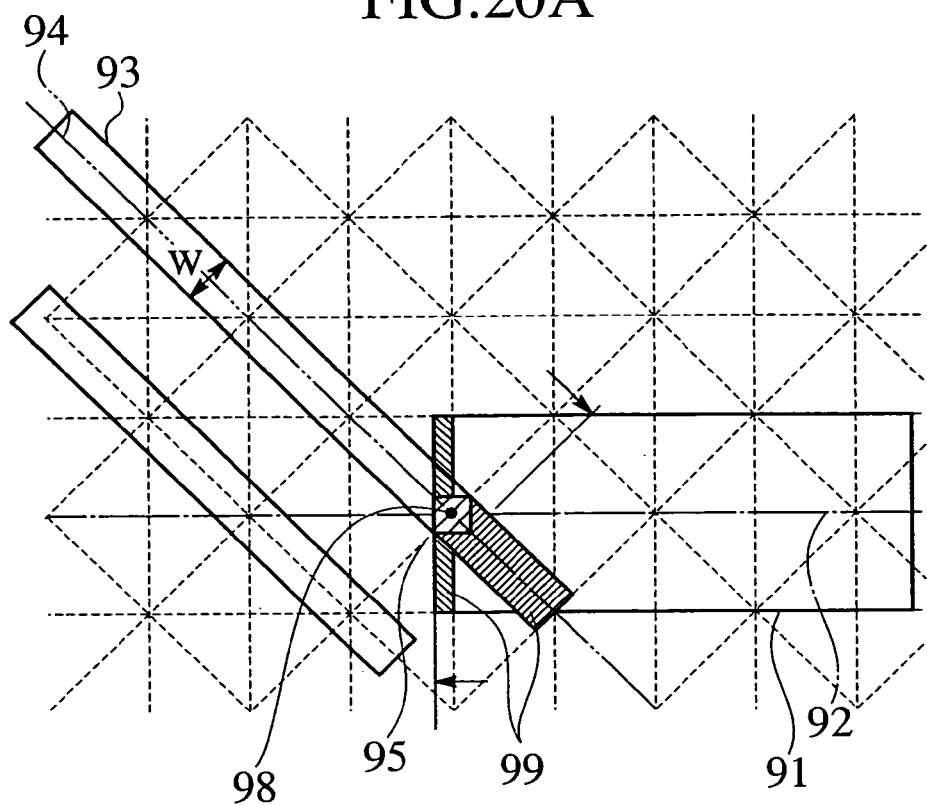
FIGS. 20A and 20B are drawings for explaining a layout design method according to a modification of the fourth embodiment of the present invention.

FIG. 20A is a plan view showing a line layout prepared on CAD by the layout design method according to the modification of the fourth embodiment. A horizontal line 91 having a wider line width, which extends horizontally, is generated. Subsequently, an oblique line 93 with a narrower line width compared to the horizontal line 91, which extends obliquely at an angle unperpendicularly relative to the horizontal line 91, is generated. An intersection point 98 exists at an intersection of a longitudinal center line 92 of the horizontal line 91 and a longitudinal center line 94 of the oblique line 93. An end portion of the horizontal line 91 terminates at a position apart from the intersection point 98 by a length ½ times as long as the line width of the oblique line 93. An end portion of the oblique line 93 terminates at a position apart from the intersection point 98 by a length ½ times as long as the line width of the horizontal line 91. A terminal end of the oblique line 93 overlaps a terminal end of the horizontal line 91, and forms an overlapped area. In this overlapped area, a turn via 95 connecting the horizontal line 91 and the oblique line 93 is set at the intersection point 98.

Figure 20B:
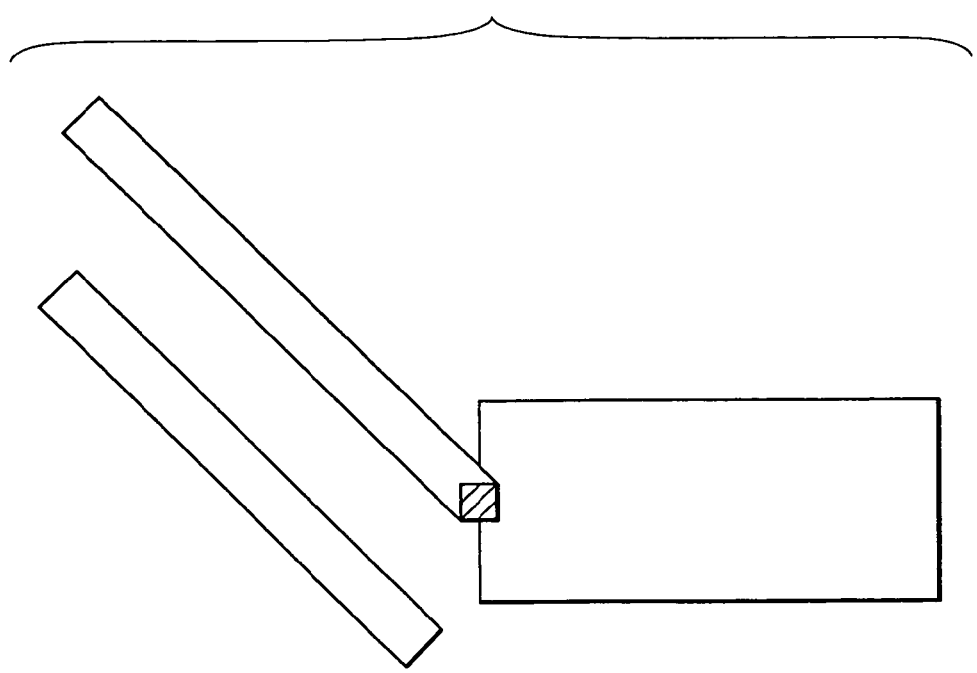

In the modification of the fourth embodiment, a deletion of a redundancy portion is performed. Specifically, as shown in FIG. 20A, the shaded 99 area is deleted in the terminal end of the horizontal line 91 and the terminal end of the oblique line 93. Thus, the shape after the wire terminating process is obtained as shown in FIG. 20B.

(Fifth Embodiment of Layout Design Method)

In a fifth embodiment of the layout design method, an embodiment in which a rectangular VIA is used in lines of different levels, and a horizontal line and an oblique line have wider line widths particularly will be described.

Figure 21A:
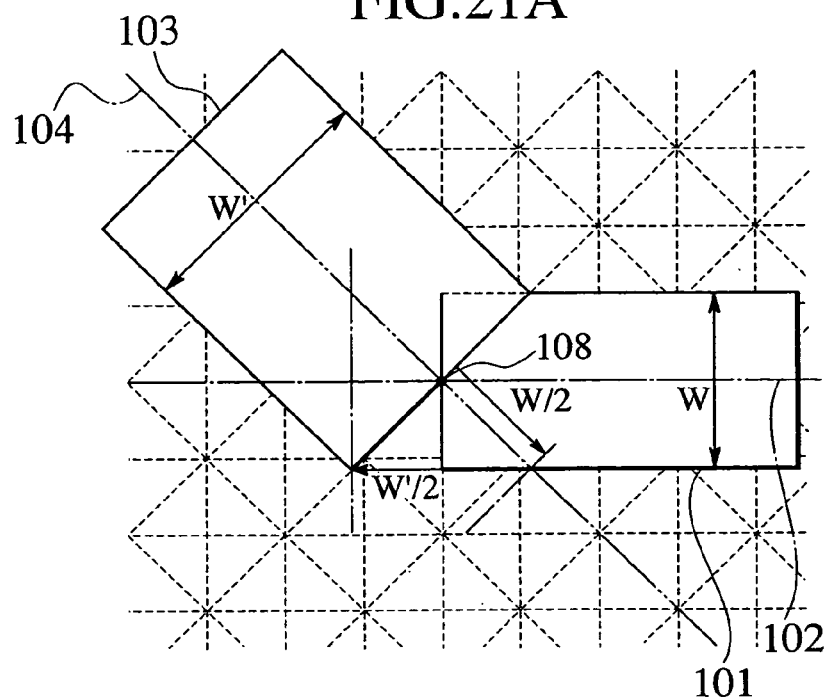
FIGS. 21A to 21C are drawings for explaining a layout design method according to a fifth embodiment of the present invention.

FIG. 21A shows a line layout prepared on CAD by the layout design method according to the fifth embodiment. As shown in FIG. 16A, a horizontal line 101 with a wider line width, which extends horizontally, is generated in a lower level (a third level). Next, an oblique line 103 with a wider line width, which extends obliquely at an angle unperpendicularly relative to the horizontal line 101, is generated in an upper level (a forth level). The horizontal line 101 and the oblique line 103 may have the same line width, or alternatively may have the different line widths. An intersection point 108 exists at an intersection of a longitudinal center line 102 of the horizontal line 101 and a longitudinal center line 104 of the oblique line 103. An end portion of the horizontal line 101 terminates at a position apart from the intersection point 108 by a length ½ times as long as the line width of the oblique line 103. An end portion of the oblique line 103 terminates at a position apart from the intersection point 108 by a length ½ times as long as the line width of the horizontal line 101.

Figure 21B:
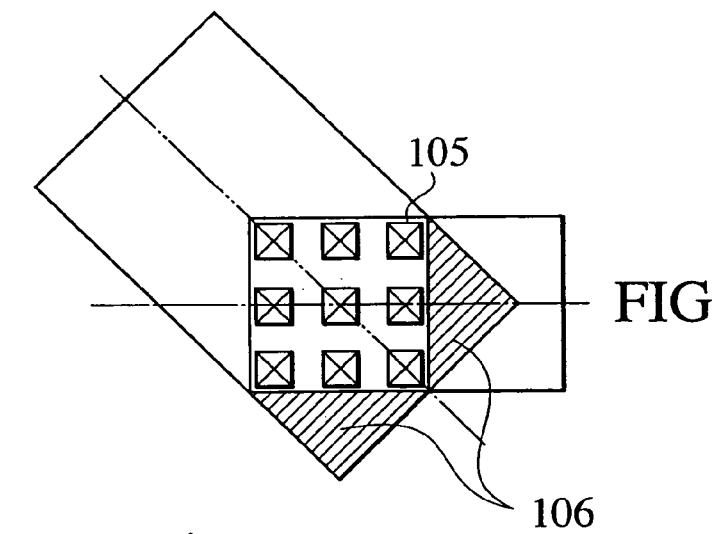
Figure 21C:
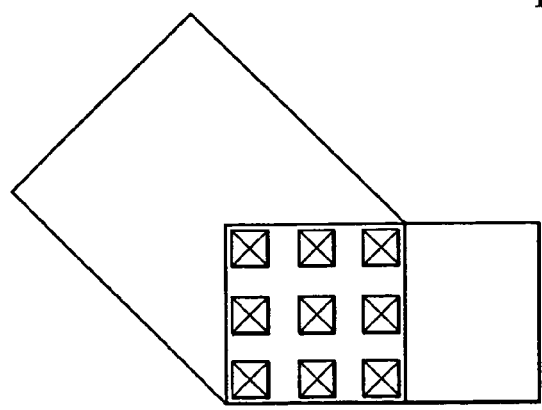

As shown in FIG. 21B, terminal ends of the horizontal and oblique lines 101 and 103 are coincident with each other, and an overlapped area is set at this portion. In this case, the shaded area 106 of the terminal end of the oblique line 103 is deleted, and a plurality of connection patterns (via) 105 are set at the overlapped area. The number of the set connection patterns (via) 105 depends on a size of the overlapped area. Thus, the shape after the wire terminating process as shown in FIG. 21C is obtained.

(Sixth Embodiment of Layout Design Method)

In sixth to eighth embodiments of the layout design method, described are embodiments of the layout design method for a horizontal line and an oblique line, in which the most suitable octagonal VIA is used when lines in directions of 0°, 90°, 45° and 135° are used.

Figure 22A:
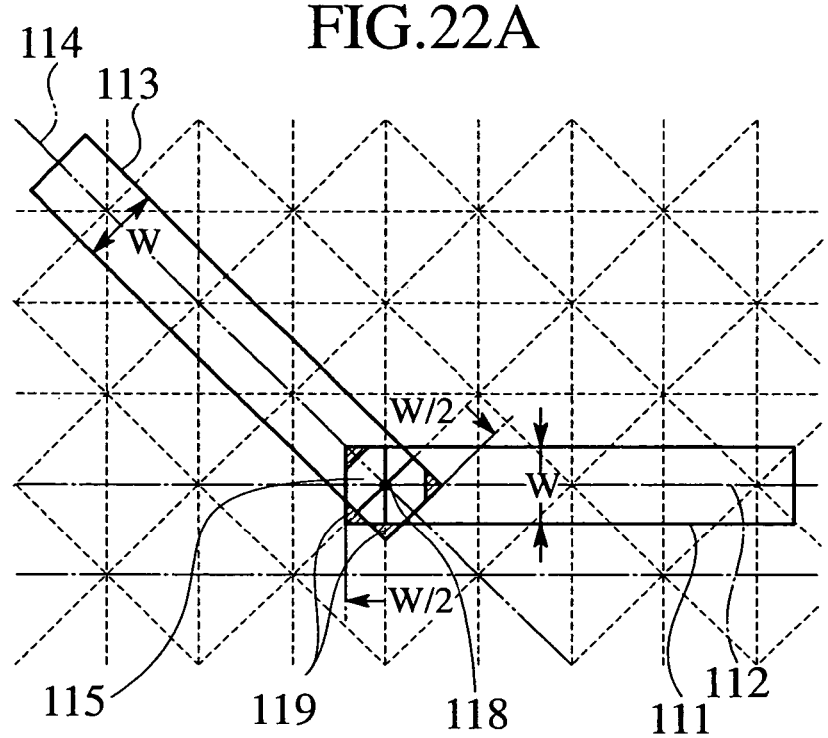
FIGS. 22A to 22D are drawings for explaining a layout design method according to a sixth embodiment of the present invention.

FIG. 22A shows a line layout prepared on CAD by the layout design method according to the sixth embodiment of the layout design method. First, a horizontal line 111 with a minimum line width, which extends horizontally, is generated in a lower level. Subsequently, an oblique line 113 with the same line width as that of the horizontal line 111, which extends obliquely at an angle unperpendicularly relative to the horizontal line 111, is generated in an upper level. An intersection point 118 exists at an intersection of a longitudinal center line 112 of the horizontal line 111 and a longitudinal center line 114 of the oblique line 113. An end portion of the horizontal line 111 terminates at a position apart from the intersection point 118 by a length ½ times as long as the line width of the oblique line 113. An end portion of the oblique line 113 terminates at a position apart from the intersection point 118 by a length ½ times as long as the line width of the horizontal line 111. A terminal end of the oblique line 113 overlaps a terminal end of the horizontal line 111, and forms an overlapped area. In this overlapped area, a connection pattern (via) 115 connecting the horizontal line 111 and the oblique line 113 is set at the intersection point 118. Moreover, in the terminal ends of the horizontal and oblique lines 111 and 113, the shaded area 119 is deleted. Thus, the connection pattern (via) 115 forms an octagon. As a result, the shape after the wire terminating process as shown in FIG. 22D is obtained.

Figure 22B:
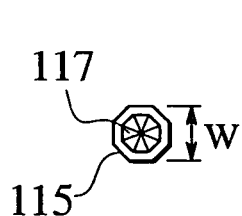
Figure 22C:
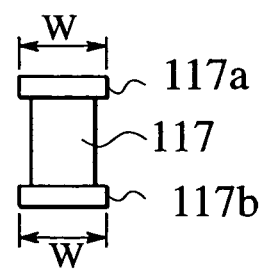
Figure 22D:
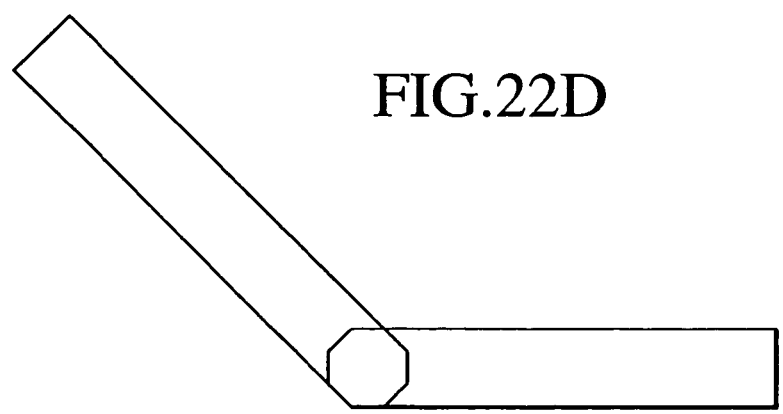

FIGS. 22B and 22C are a top view and a sectional view which define the shape of the connection pattern (via) 115 with EDA (placement and routing tool). In FIG. 22B, the innermost octagon of the connection pattern (via) 115 is a cut 117. In addition, as shown in FIG. 22C, the connection pattern (via) 115 has metals with the same line widths as those of the horizontal line 111 and the oblique line 113 in lower and upper levels, and the upper level metal 117a and the lower level metal 117b are connected by the cut 117. The cut 117 is blocked by the upper level metal 117a completely. With this constitution, it is possible to prevent the lower level metal 117b from melting during a high temperature processing in an actual processing.

Figure 23A:
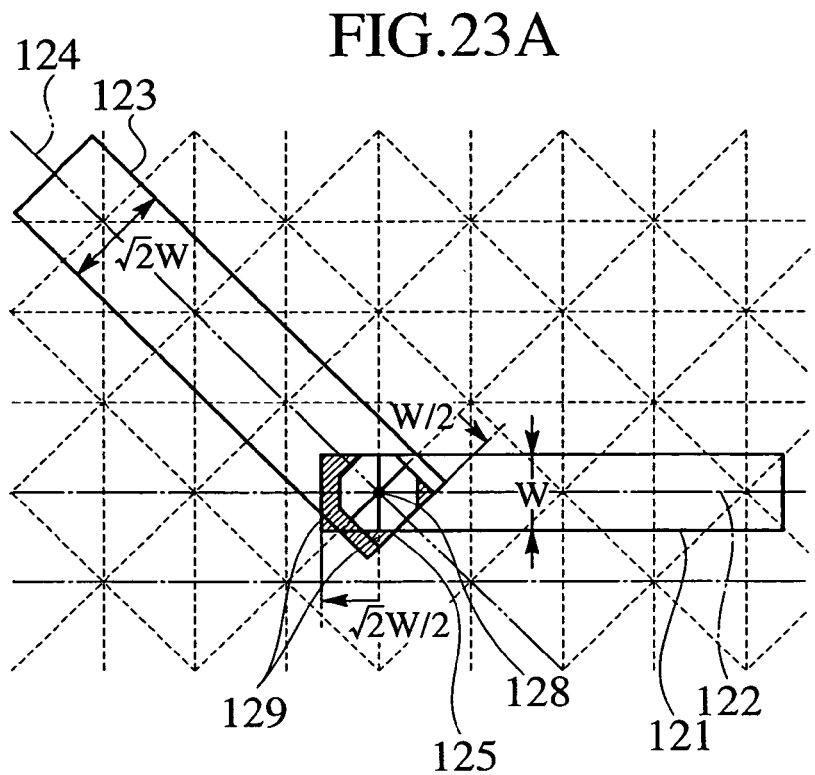
FIGS. 23A to 23D are drawings for explaining a layout design method according to a modification of the sixth embodiment of the present invention.

FIG. 23A shows a line layout prepared on CAD by a modification of the sixth embodiment. First, a horizontal line 121 with a minimum line width, which extends horizontally, is generated in a lower level. Subsequently, an oblique line 123 with a line width $2^{1/2}$ times as wide as that of the horizontal line 121, which extends obliquely at an angle unperpendicularly relative to the horizontal line 121, is generated in an upper level. An intersection point 128 exists at an intersection of a longitudinal center line 122 of the horizontal line 121 and a longitudinal center line 124 of the oblique line 123. An end portion of the horizontal line 121 terminates at a position apart from the intersection point 128 by a length ½ times as long as the line width of the oblique line 123. An end portion of the oblique line 123 terminates at a position apart from the intersection point 128 by a length ½ times as long as the line width of the horizontal line 121. A terminal end of the oblique line 123 overlaps a terminal end of the horizontal line 121, and forms an overlapped area. In this overlapped area, a connection pattern (via) 125 connecting the horizontal line 121 and the oblique line 123 is set at the intersection point 128. Moreover, in the terminal end of the horizontal line 121 and the terminal end of the oblique line 123, the shaded area 129 is deleted. Thus, the connection pattern (via) 125 forms an octagon. As a result, the shape after the wire terminating process as shown in FIG. 23D is obtained.

Figure 23B:
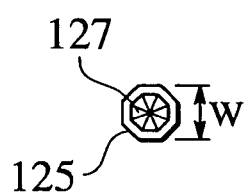
Figure 23C:
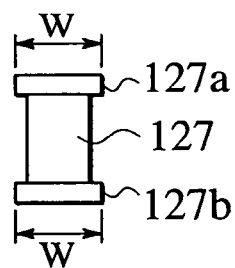

FIGS. 23B and 23C are a top view and a side view which define the shape of the connection pattern (via) 125 with EDA (placement and routing tool). In FIG. 23B, the innermost octagon of the connection pattern (via) 125 is a cut 127. In addition, as shown in FIG. 23C, the connection pattern (via) 125 has metals with the same line width as that of the horizontal line 121 in lower and upper levels, and the upper level metal 127a and the lower level metal 127b are connected by the cut 127.

Figure 23D:
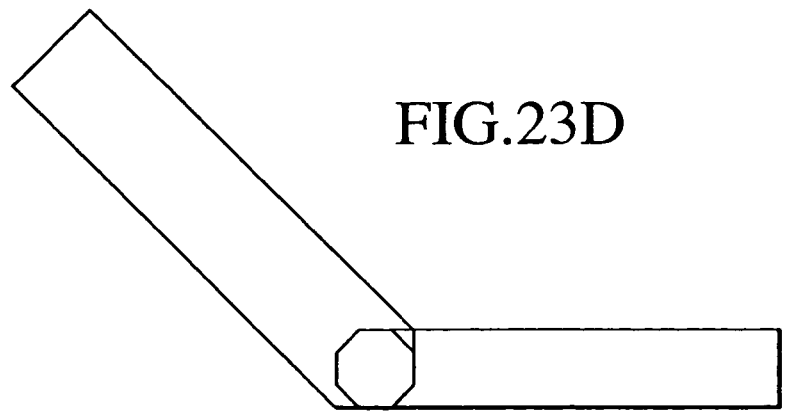

A first feature of the layout design method of the pattern shown in FIGS. 22A to 22D and FIGS. 23A to 23D is that the horizontal lines 111 and 121 and the oblique lines 113 and 123 fully overlap in their terminal ends, and there is no projection protruding from a contour of each line. Since there is no portion protruding from the contour of each line, an increase in coupling capacitance between the lines adjacent to each other and an adverse influence on a substrate capacitance hardly exist. Moreover, there is no waste of line resources in the oblique line at all. Particularly, as shown in FIGS. 22D and 23D, a line can be generated close to the horizontal lines 111 and 121 because of inexistence of the projection.

(Seventh Embodiment of Layout Design Method)

In a seventh embodiment of the layout design method, an embodiment of the layout design method of a horizontal line and an oblique line in a case where an octagonal VIA is used in the lines of the same level will be described.

Figure 24A:
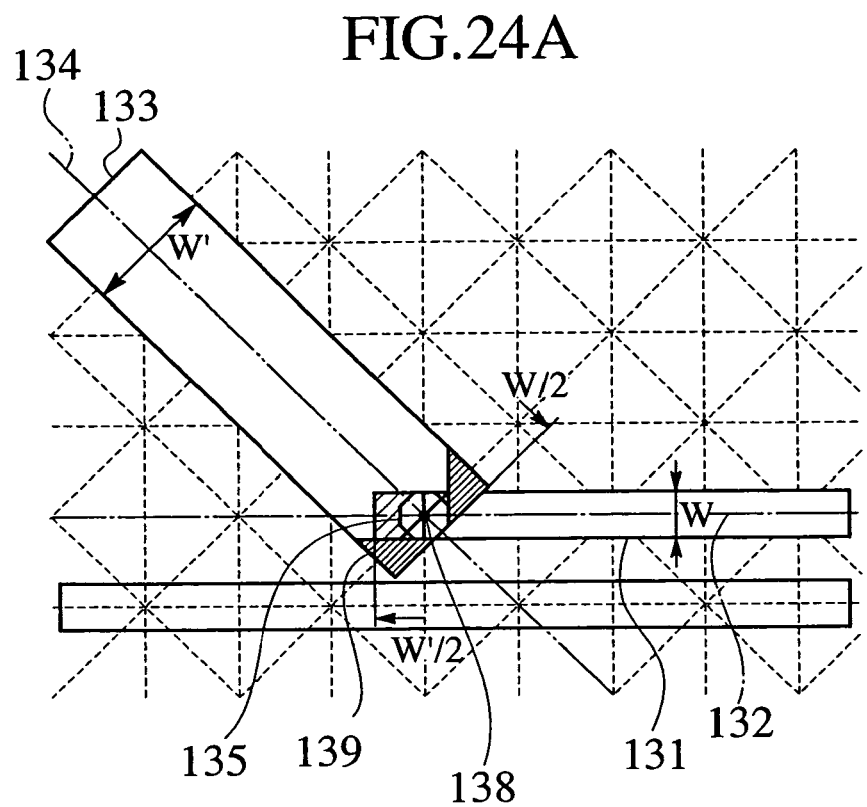
FIGS. 24A and 24B are drawings for explaining a layout design method according to a modification of a seventh embodiment of the present invention.
Figure 24B:
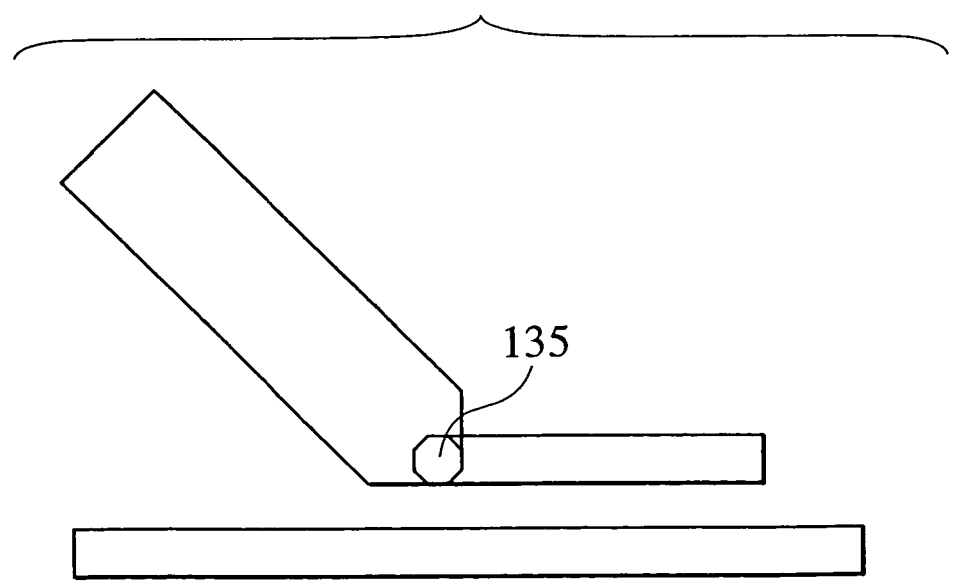

FIG. 24A shows a line layout prepared on CAD by the layout design method according to the seventh embodiment. First, a horizontal line 131 with a minimum line width, which extends horizontally, is generated. Subsequently, an oblique line 133 with a different line width from that of the horizontal line 131, which extends obliquely at an angle unperpendicularly relative to the horizontal line 131, is generated. An intersection point 138 exists at an intersection of a longitudinal center line 132 of the horizontal line 131 and a longitudinal center line 134 of the oblique line 133. An end portion of the horizontal line 131 terminates at a position apart from the intersection point 138 by a length ½ times as long as the line width of the oblique line 133. An end portion of the oblique line 133 terminates at a position apart from the intersection point 138 by a length ½ times as long as the line width of the horizontal line 131. A terminal end of the oblique line 133 overlaps a terminal end of the horizontal line 131, and forms an overlapped area. In this overlapped area, a turn via 135 connecting the horizontal line 131 and the oblique line 133 is set at the intersection point 138. Moreover, the shaded area 139 is deleted in the terminal end of the horizontal line 131 and the terminal end of the oblique line 133. Thus, the turn via 135 forms an octagon. As a result, the shape after the wire terminating process as shown in FIG. 24B is obtained.

(Eighth Embodiment of Layout Design Method)

In an eighth embodiment of the layout design method, an embodiment of the layout design method of a horizontal line, a vertical line and an oblique line in a case where an octagonal VIA is used in branch lines in three or more levels will be described.

Figure 25A:
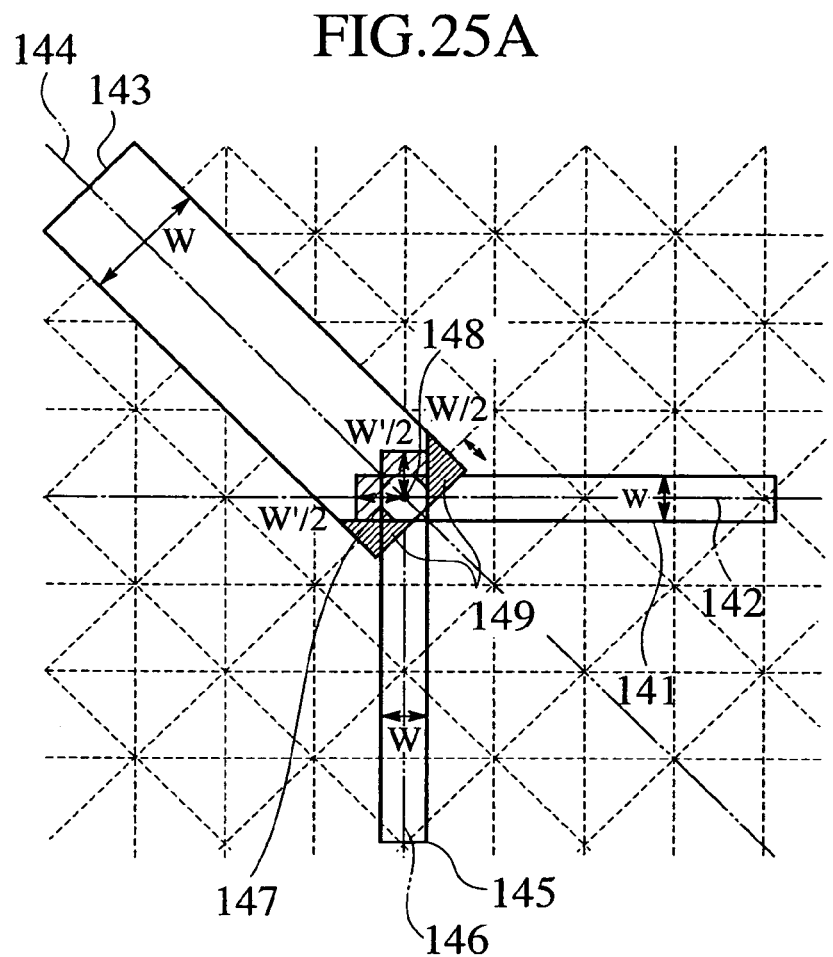
FIGS. 25A and 25B are drawings for explaining a layout design method according to a modification of an eighth embodiment of the present invention.
Figure 25B:
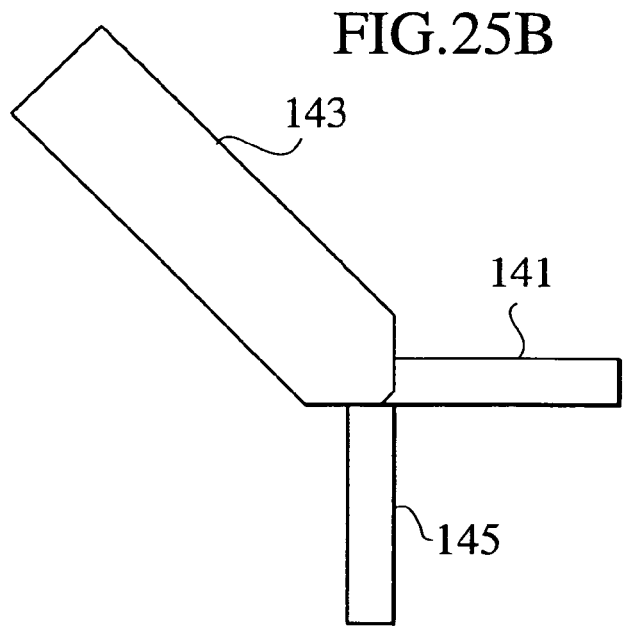

FIG. 25A shows a line layout prepared on CAD by the layout design method according to the eighth embodiment. First, a vertical line 145 with a minimum line width, which extends vertically, is generated in a second level. Subsequently, a horizontal line 141 with a minimum line width, which extends horizontally, is generated in a third level. Next, an oblique line 143 with a line width different from the minimum line width, which extends obliquely at an angle unperpendicularly relative to the horizontal line 141 and the vertical line 145, is generated in a fourth level. An intersection point 148 exists at an intersection of a longitudinal center line 142 of the horizontal line 141, a longitudinal center line 146 of the vertical line 145 and a longitudinal center line 144 of the oblique line 143. The horizontal line 141 and the vertical line 145 terminate at a position apart from the intersection point 148 by a length ½ times as long as the line width of the oblique line 143. The oblique line 143 terminates at a position apart from the intersection point 148 by a length ½ times as long as the line width of the horizontal line 141 and the vertical line 145. A terminal end of the oblique line 143 overlaps terminal ends of the horizontal line 141 and the vertical line 145, and forms an overlapped area. In this overlapped area, a connection pattern (via) 147 connecting the horizontal line 141, the vertical line 145 and the oblique line 143 is set at the intersection point 148. Moreover, in the terminal ends of the horizontal line 141, the vertical line 145 and the oblique line 143, the shaded area 149 is deleted. Thus, the connection pattern (via) 147 forms an octagon. As a result, the shape after the wire terminating process as shown in FIG. 25B is obtained.

As described in the seventh and eighth embodiments, the octagonal via can be used in the lines of all of the patterns. In the octagonal via, there is no waste of the line recourses at all compared to the rectangular via, lozenge via and parallelogram via, and the lines can be connected by a via having a minimum area.

(Ninth Embodiment of Layout Design Method)

In a ninth embodiment of the layout design method, an embodiment of the layout design method of a horizontal line, a vertical line and an oblique line in a case where a VIA comprising an octagonal metal and a rectangular cut is used in branch lines in two or more levels will be described.

Figure 26A:
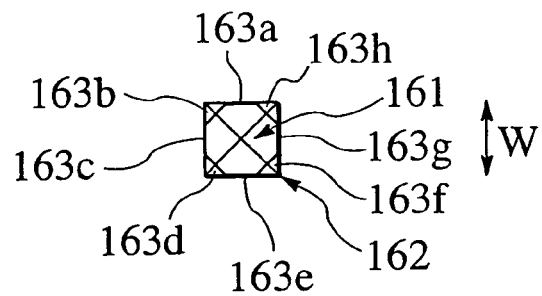
FIGS. 26A to 26D are drawings for explaining a layout design method according to a ninth embodiment of the present invention.

FIG. 26A is a top view of a VIA used by the layout design method according to the ninth embodiment. As shown in FIG. 26A, a rectangular cut 162 and a metal 161 are provided. The metal 161 has a shape obtained by cutting off four corners of the cut 162, and forms an octagon having edges 163a to 163h.

Figure 26B:
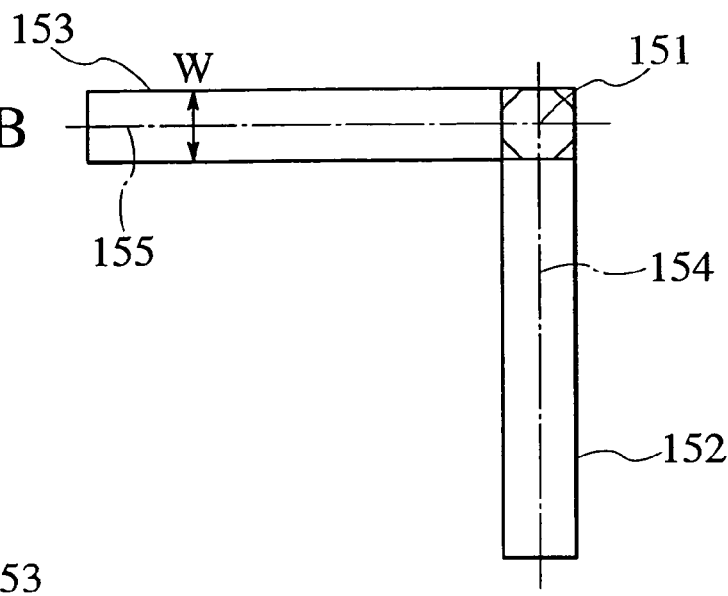
Figure 26C:
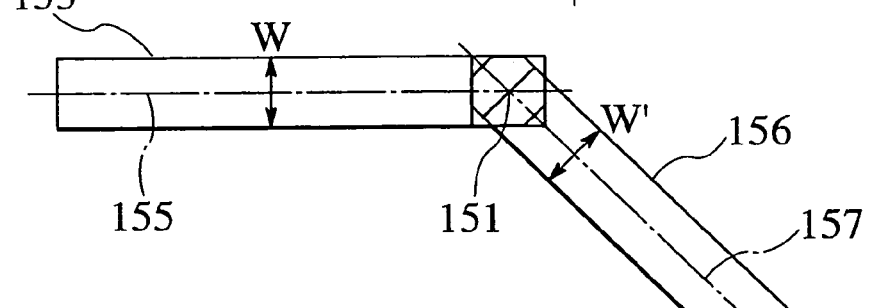
Figure 26D:
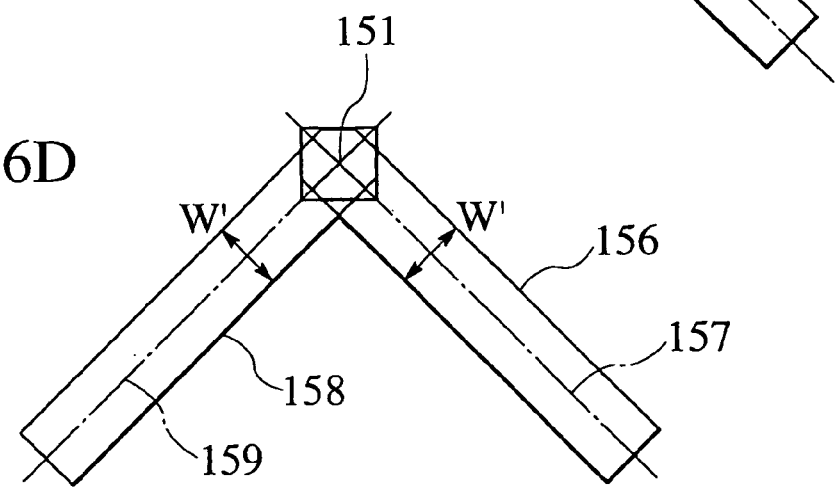

FIGS. 26B to 26D show a line layout prepared on CAD by the layout design method according to the ninth embodiment.

As shown in FIG. 26B, first, a vertical line 152 with a line width W, which extends vertically, is generated in an upper level, and a horizontal line 153 with the line width W, which extends horizontally, is generated in a lower level. Herein, the VIA shown in FIG. 26A is disposed on an intersection point 151 where a longitudinal center line 154 of the vertical line 152 and a longitudinal center line 155 of the horizontal line 153 intersect. In FIG. 26B, the edge 163a of the metal 161 and a terminal end of the vertical line 152 are overlapped, and the edge 163g of the metal 161 and a terminal end of the horizontal line 153 are overlapped.

As shown in FIG. 26C, first, an oblique line 156 with a line width W', which extends obliquely, is generated in the upper level, and a horizontal line 153 with the line width W, which extends horizontally, is generated in the lower level. Herein, the VIA shown in FIG. 26A is disposed on the intersection point 151 where a longitudinal center line 157 of the oblique line 156 and the longitudinal center line 155 of the horizontal line 153 intersect. In FIG. 26C, the edge 163b of the metal 161 and a terminal end of the oblique line 156 are overlapped, and the edge 163g of the metal 161 and the terminal end of the horizontal line 153 are overlapped.

As shown in FIG. 26D, first, the oblique line 156 with the line width W', which extends obliquely, is generated in the lower level, and an oblique line 158 with the line width W', which extends obliquely in a different direction from the oblique line 156, is generated in the upper level. Herein, the VIA shown in FIG. 26A is disposed on the intersection point 151 where the longitudinal center line 157 of the oblique line 156 and a longitudinal center line 159 of the oblique line 158 intersect. In FIG. 26D, the edge 163b of the metal 161 and the terminal end of the oblique line 156 are overlapped, and the edge 163h of the metal 161 and a terminal end of the oblique line 158 are overlapped.

In the ninth embodiment, the horizontal line, the vertical line and the oblique line are connected to any of other lines among these horizontal, vertical and oblique lines, a countermeasure can be taken by use of the octagonal via. Accordingly, since the same via can be used for all lines, a cost can be decreased.

(Embodiment of Method of Manufacturing Semiconductor Integrated Circuit)

An example in which an oblique line structure is formed on a semiconductor substrate and a semiconductor integrated circuit is manufactured by use of a mask manufactured based on a layout by the above described automatic design method will be described below.

Figure 27:
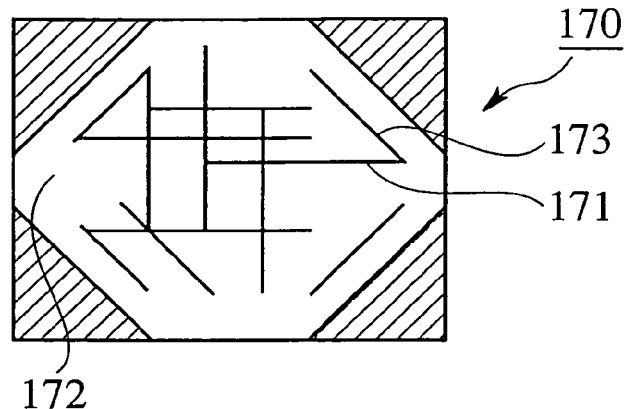
FIG. 27 is a schematic plan view showing a part of a semiconductor integrated circuit fabricated based on a terminal layout of an oblique line generated by the layout design method of the present invention.

As shown in FIG. 27, an oblique line structure in which an oblique line 173 and a basic orthogonal line including a horizontal line 171 are intermingled on a transistor area 172 of a cell (semiconductor integrated circuit) 170 is schematically shown, and a detailed line structure and the like are omitted.

Figure 28A:
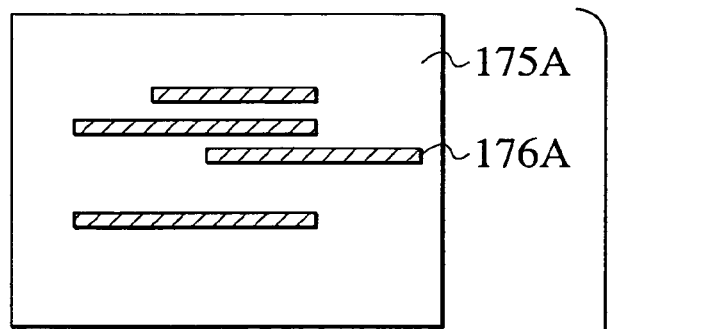
FIGS. 28A to 28C illustrate an exposure mask set according to the embodiment of the present invention, which is fabricated based on a line pattern generated by the layout design method of the present invention.
Figure 28B:
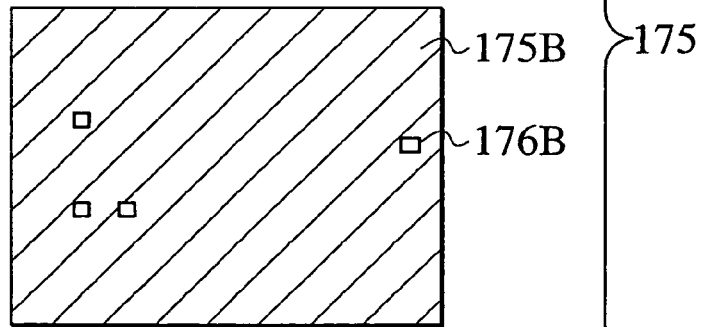
Figure 28C:
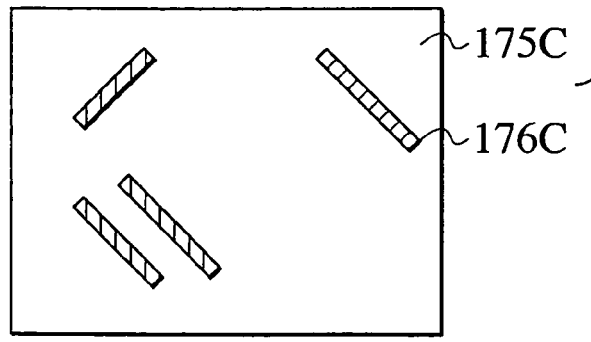

To prepare this oblique line structure, design data of a mask pattern generated by the automatic design method of the foregoing line pattern is input to a computer of a pattern generator such as an optical exposure apparatus, an electron beam exposure apparatus and an X-ray exposure apparatus, and a predetermined exposure mask (reticle) may be drawn by use of the design data. The reticle is prepared by ten to several tens or more in number according to manufacturing processes and contents of the semiconductor integrated circuit. FIGS. 28A to 28C show an exposure mask set 175 which shows three reticles extracted from a part of such a plurality of reticle sets. For convenience of descriptions, a part of the mask pattern of each mask is illustrated.

The mask set 175 shown in FIGS. 28A to 28C includes a first mask 175A, a second mask 175B and a third mask 175C. In the first mask 175A, an opaque pattern (light shielding area) 176A serving as a horizontal line pattern (first level line) 176A extending horizontally is formed of a chromium (Cr) film or the like on a mask substrate such as quartz glass. In an opaque area, the second mask 175B has an opening portion 176B serving as a cut pattern of a via hole. The third mask 175C has an opaque pattern composed of an oblique line pattern 176C extending obliquely at an angle of 45° or 135° relative to the horizontal line pattern. The design data is constituted so that a terminal end of the oblique line pattern 176C, a position of the cut pattern 176B and a terminal end of the horizontal line pattern 176A overlap when the first to third masks are overlapped.

It is possible to realize the oblique line structure as shown in FIG. 27 by use of a series of mask sets (reticle set) including the mask set 175 shown in FIGS. 28A to 28C. To form transistor portions and other line structures, though other mask sets are, as a matter of course, necessary, descriptions thereof are omitted.

Figure 29:
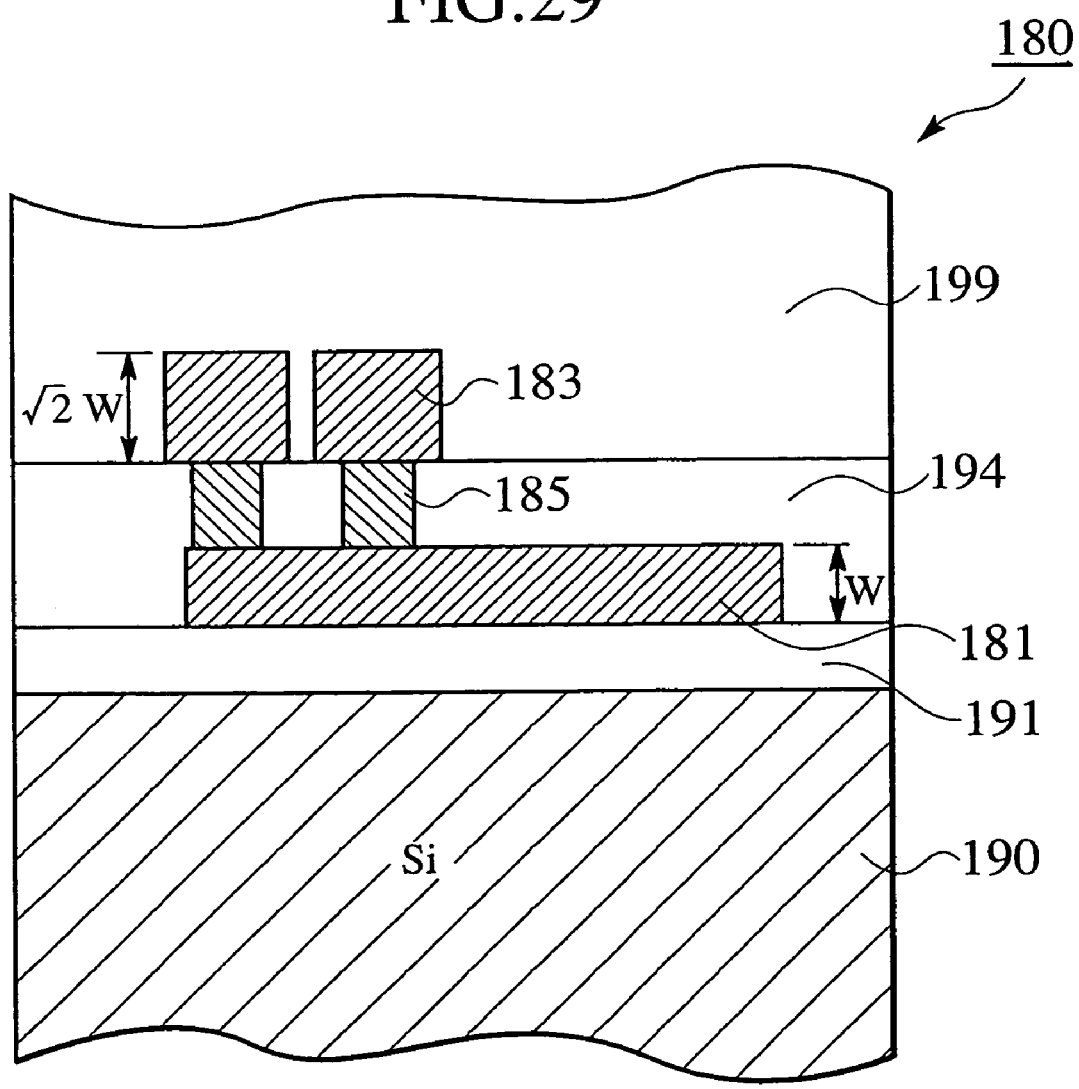
FIG. 29 is a sectional view schematically showing a part of a semiconductor interacted circuit having an oblique line structure.

As shown in FIG. 29, an oblique line structure 180 includes: a basic orthogonal line 181 extending horizontally or vertically, which is disposed on a first level interlayer insulating film 191 on a Si substrate 190; a second level interlayer insulating film 194 disposed on the basic orthogonal line 181; an oblique line 183 disposed on the second level interlayer insulating film 194, which is composed of oblique lines extending obliquely at an angle of 45° or 135° relative to the basic orthogonal line 181; a via hole 185 formed so as to penetrate through an insulating film 182, which connects the basic orthogonal line 181 and the oblique line 183; and a connection conductive member buried in the via hole. A passivation film or a third level interlayer insulating film 199 is formed on the oblique line 183.

A connection conductive portion is formed by the via hole 185 and the connection conductive member. The connection conductive portion can be formed at one or more positions including at least an intersection point of a longitudinal center line of the basic orthogonal line 181 and a longitudinal center line of the oblique line 183.

Note that the technical terms "the first level interlayer insulating film" and "the second level interlayer insulating film" are adopted in consideration for convenience for explanations. Actually, it will do that another level interlayer insulating film and a metallic line film disposed under the first and second level interlayer insulating films are included.

Referring to FIGS. 30A to 30H, processes for forming the oblique line structure 180 of FIG. 29 will be described.

Figure 30A:
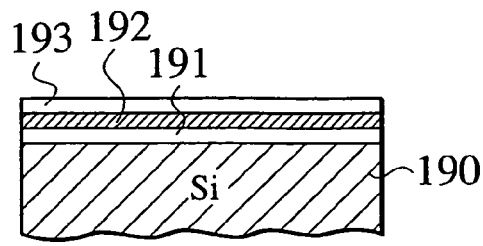
FIGS. 30A to 30H are drawings showing formation steps of the oblique line structure shown in FIG. 29.

(a) As shown in FIG. 30A, by sputtering or vacuum evaporation, a first-level metallic film 192 such as Al alloy is first deposited on the Si substrate 190 covered with the first level interlayer insulating film 191 such as an oxide film ($SiO_2$). The first-level metallic film 192 is deposited by sputtering and vacuum evaporation. Furthermore, a positive-type resist 193 is spin-coated to cover the first-level metallic film 192.

(b) Next, the Si substrate 190 is disposed on an exposure stage of an exposure apparatus such as a stepper, and the positive-type resist 193 is exposed and developed by use of the reticle (first mask) 175A having the horizontal line pattern. As a result, the resist in a portion corresponding to the horizontal line pattern remains as shown in FIG. 30B.

(c) Using the photoresist pattern in this state as a mask, the first-level metallic film 192 is etched by reactive ion etching (RIE), and then the resist is removed. Thus, the horizontal line 182 is formed as shown in FIG. 30C.

(d) Next, the second level interlayer insulating film 194 such as an oxide film, Phosphosilicate-glass (PSG) and Borophosphate-silicate-glass (BPSG) is deposited on the horizontal line 181 by CVD or the like. Then, as shown in FIG. 30D, the second level interlayer insulating film 194 is covered with a positive-type resist 195. When a negative-type resist 195 is used in stead of the positive-type resist, it is natural that the second mask 175B shown in FIG. 28B is a mask in which black and white turn over.

(e) The Si substrate 190 is introduced onto the exposure stage of the exposure apparatus again, and a cut pattern is exposed and developed by use of the second mask 175B. As shown in FIG. 30E, a photoresist pattern in which only a resist corresponding to an opening pattern of the cut is removed is completed. With this photoresist as a mask, a via hole 196 is formed in the second level interlayer insulating film 194 by etching such as RIE.

Figure 30F:
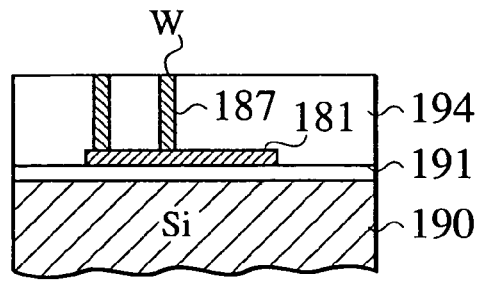
Figure 30B:
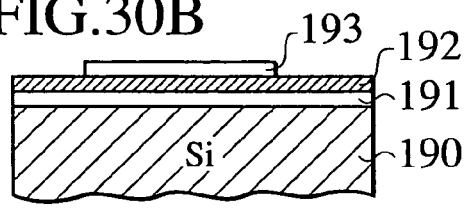

(f) Thereafter, the positive-type resist 195 is removed, and the via hole 196 is filled with the connection conductive member such as tungsten (W) by use of a CVD method, a sputtering method and a vacuum evaporation method as shown in FIG. 30F. Thereafter, the surface of the resultant structure is flattened by a chemical mechanical polishing (CMP) method or the like.

Figure 30G:
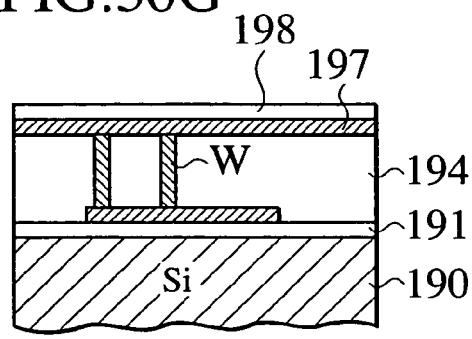
Figure 30C:
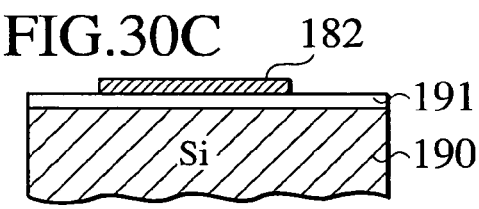
Figure 30D:
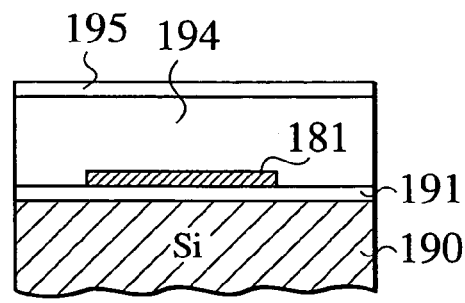

(g) As shown in FIG. 30G, a second-level metallic film 197 such as Al alloy is formed on the second level interlayer insulating film 194 and the connection conductive member by sputtering and vacuum evaporation. Moreover, a positive-type resist 198 is spin-coated thereon.

Figure 30H:
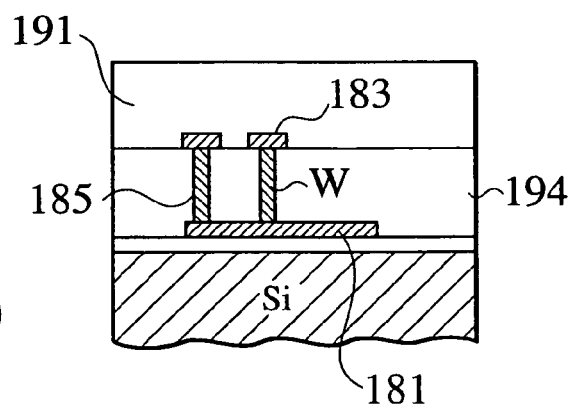
Figure 30E:
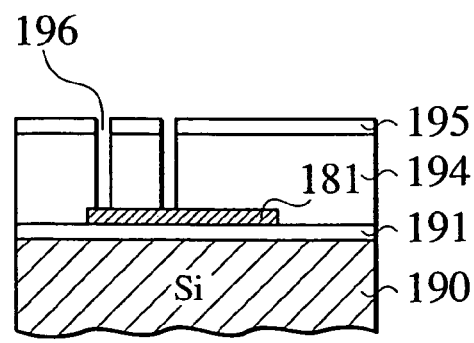

(h) The oblique line pattern is exposed and developed by use of the third mask 175C in the stepper. As a result, a portion of the resist corresponding to the oblique line pattern remains. In this state, the second-level metallic film 197 is etched by use of RIE, and the oblique line structure 183 is formed as shown in FIG. 30H. Thereafter, a passivation film or a third level interlayer insulating film such as an oxide film, PSG, BPSG, a nitride film ($Si_3N_4$), a polyimide film or the like is deposited on the oblique line structure 183 by use of the CVD method.

The example in which the first and second-level metallic films 181 and 197 are connected by the connection conductive member was described in the above. It is natural that the second-level metallic film and the third-level metallic film formed thereon may be connected, and the third-level metallic film and another metallic film formed thereon such as a fourth-level metallic film may be connected. Moreover, as described already, metallic films under the first-level metallic film 181 may exist, and it is natural that connections of these metallic films and the above metallic films are possible.

In addition, although the method of manufacturing a semiconductor integrated circuit using the exposure mask set 175 was described, a method will do, in which a drawing apparatus is directly driven with the foregoing design data without using the exposure mask set 175, and drawing is performed directly onto a semiconductor wafer.

Furthermore, it is easily understood from the purpose of the present invention that at least one of the first and second-level metallic films 181 and 197 may be a line other than Al alloy, such as Damascus line of copper (Cu).

Concrete examples of the semiconductor integrated circuit using the layout design method of the present invention will be described below.

(Example of First Semiconductor Integrated Circuit)

Figure 31:
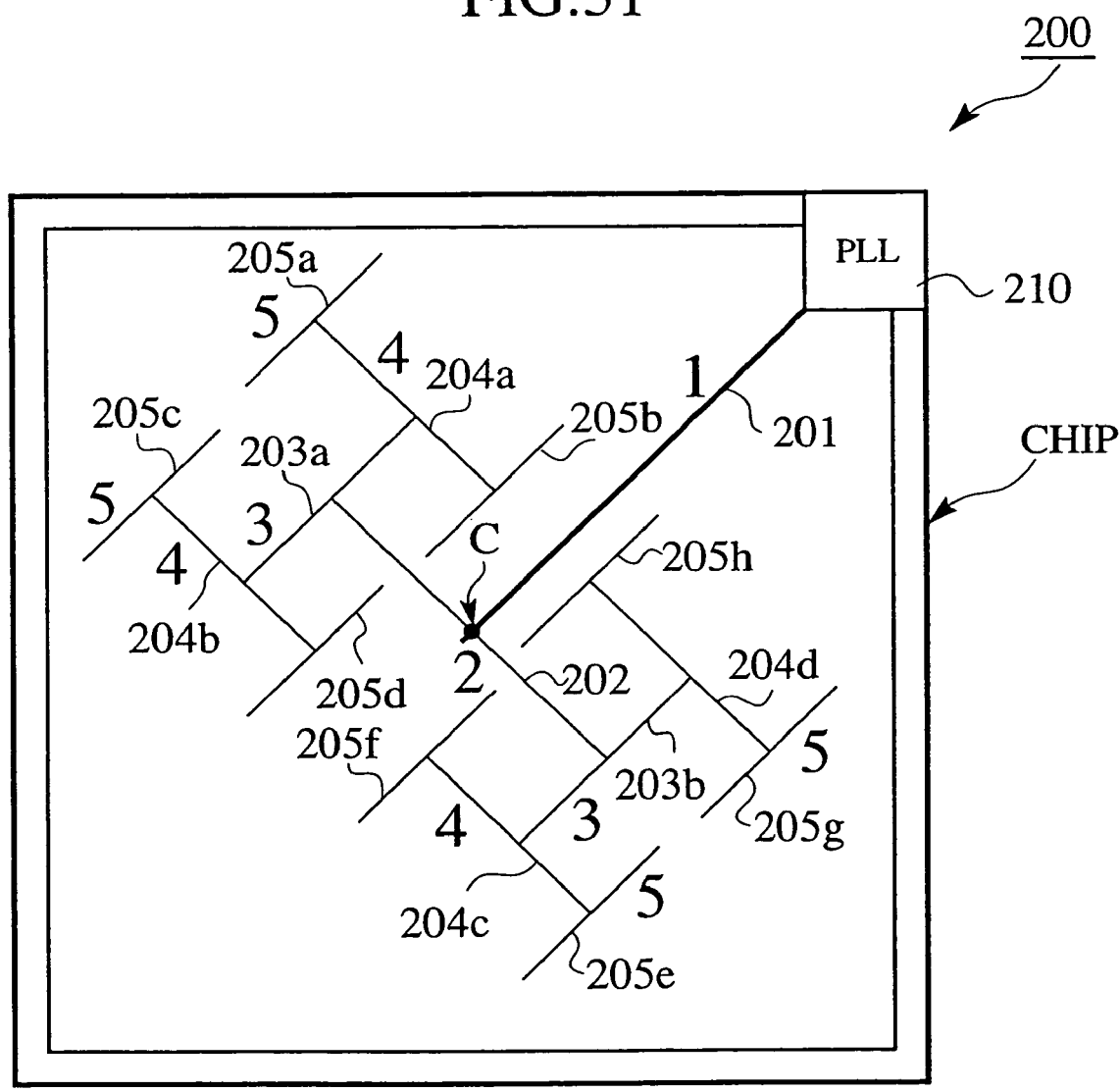
FIG. 31 is a plan view of a semiconductor integrated circuit having a clock tree constituted by the oblique lines according to the embodiment of the present invention.

As shown in FIG. 31, a first semiconductor integrated circuit 200 comprises: a Phase Locked Loop (PLL) 210 positioned at a corner of a semiconductor chip; a main clock line 201 which extends obliquely from the PLL 210 to the-center of the chip at an angle of 45° relative to a basic orthogonal coordinate axis and terminates at the center of the chip; and a clock tree line which branches symmetrically so as to extend from a terminal end C of the main clock line obliquely at angles of 45° and 135° relative to the basic orthogonal coordinate axis. In FIG. 31, reference numerals 1 to 5 represented in bold face type indicate a branch class of the clock tree line.

Specifically, an oblique line 202 of a second branch class symmetrically extends from the terminal end C of the main clock line 201 in a direction perpendicular to the main clock line 201. Oblique lines 203a and 203b 9 of a third branch class extend from both ends of the oblique line 202 symmetrically with the terminal end C of the main clock line 201 in a direction perpendicular to the oblique line 202. Furthermore, oblique lines 204a to 204d of a fourth branch class extend from both ends of each of the oblique lines 203a and 203b symmetrically with the main clock line 201. Branch lines extend symmetrically with the main clock line every time when the branch class progresses.

As a result of adopting such a branch structure, trees which are constituted by oblique lines and symmetrical with the center C of the semiconductor chip are set up all over the chip. Although illustrations are not made, basic orthogonal lines directly connected to the cell are formed in a level under the clock trees using the oblique lines alone, and end portions of the oblique lines constituting the clock trees are connected to the basic orthogonal lines as the lower level through the via hole based on the automatic design method of the foregoing terminal layout.

In the clock tree using the oblique line, lines of the same branch class belong to the same level as a rule. Accordingly, all of the four oblique lines 204a to 204d of the fourth branch class belong to the same level. Lines which are in different branch classes but extend in the same direction may belong to the same level or may belong to different levels. In the example of FIG. 31, the oblique lines 203a and 203b of the third branch class and oblique lines 205a to 205h of a fifth branch class extending in the same direction as the oblique lines 203a and 203b can be formed in the same level or in different levels.

The greatest effect achieved by using such oblique lines is that a calculation to keep balance in designing load capacitance and the like is facilitated. In addition, it is possible to hold down variations of clock delay accompanied with process change. Moreover, levels of the same branch class are disposed in the same level, and the lines are made to be symmetrical. Thus, variations depending on the line level are eliminated, and delay of clocks between two points can be shortened while keeping balance for load capacitance for each branch.

Although illustrations are not made, it is possible to narrow a line width based on a line delay calculation formula of Elmor as the branch class progresses.

With such a constitution, it is possible to realize a semiconductor integrated circuit with high performance which suppresses the load capacitance, operates at a higher speed, and shows fewer variations.

(Example of Second Semiconductor Integrated Circuit)

Figure 32:
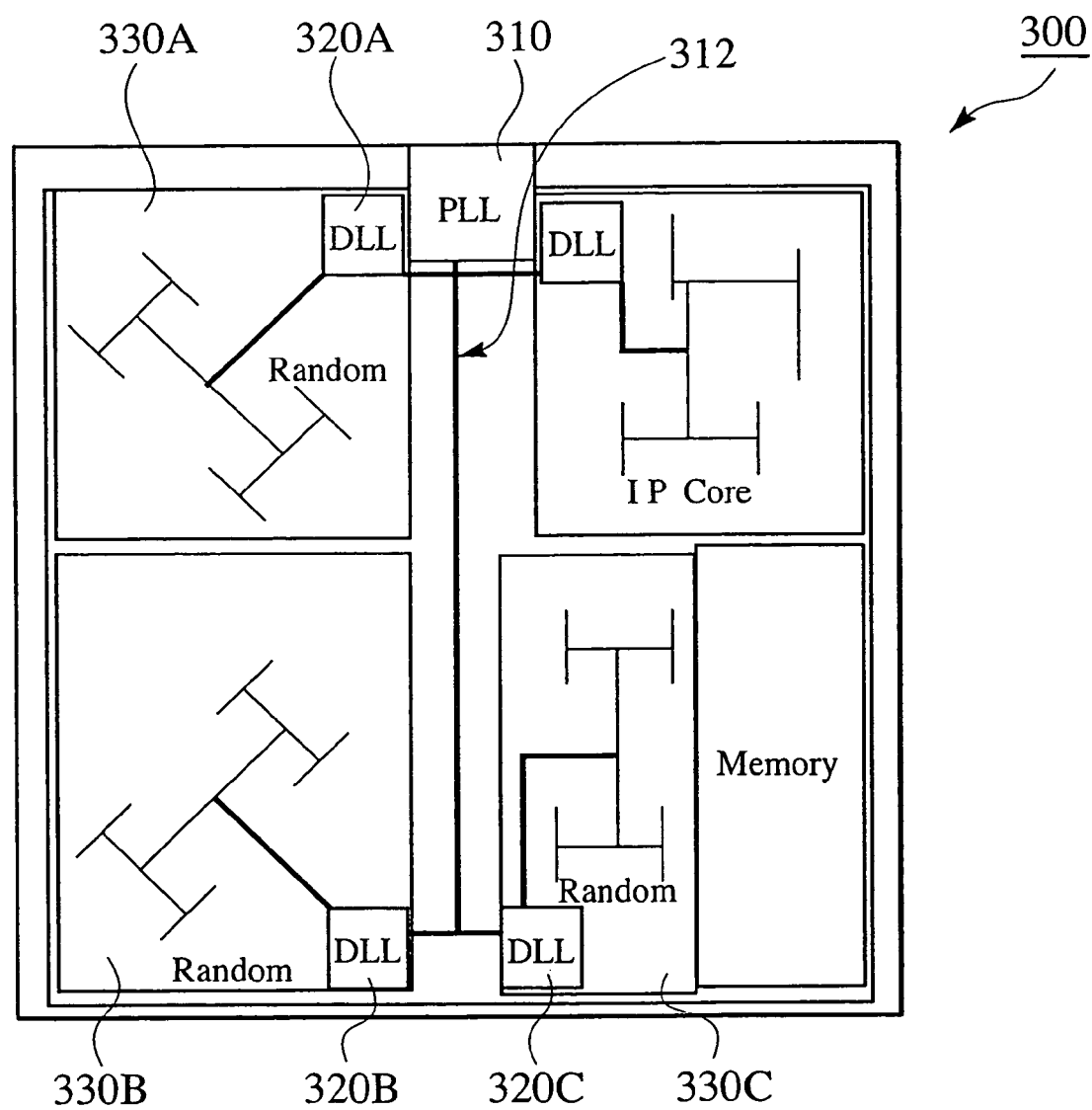
FIG. 32 is a plan view of a second semiconductor integrated circuit with a larger scale according to the embodiment of the present invention, and shows an example using the clock tree of the oblique line shown in FIG. 31 for each block.

As shown in FIG. 32, a second semiconductor integrated circuit 300 comprises: a main PLL 310 positioned in an end of the circuit, which supplies global clocks of comparatively low frequency (several hundreds MHz); a global clock line 312 extending from the main PLL 310; and a plurality of random blocks 330A and 330B. Each random block 330 comprises: a clock driver cell (Delay-Locked Loop (DLL)) in the eighth embodiment) 320 connected to the global clock line 312; and clock tress constituted of oblique lines.

The main PPL 310 regulates phases of clocks with integrated circuit devices other than a semiconductor integrated circuit loading the PPL 310. The global clocks that are basic clocks traversing the chip are supplied from the PPL 310 to a circuit block or a random block in the chip. The circuit block and the random block are an aggregate of partial circuits divisionally prepared by the designer, which are composed of a plurality of logic circuit modules. The DLL 320 provided in each random block converts the global clocks of the comparatively low frequency to local clocks of a high frequency (several GHz), and supplies the high frequency clocks to the inside of the random block through a related clock tree.

Although illustrations are not made, also in the second semiconductor integrated circuit, the clock tree of each block 330 is connected to the basic orthogonal line in the lower level through the via hole. Specifically, terminal ends of the oblique lines constituting the clock tree are surely connected to terminal ends of the basic orthogonal lines based on a line layout generated by the foregoing automatic design method.

As described above, as a LSI is fabricated to be more minute, resistivity and capacity of the line greatly affect a delay. In the collective synchronizing design of the chip, that is, the single clock design, to collectively synchronize the chip of 10 mm square, a speed of several hundred MHz is a limit. If a design more than several hundred MHz is desired, a thickness of the clock line must be set to several ten to several hundred times that of a standard signal line. This results in difficulty of manufacturing the semiconductor integrated circuit in terms of processes, and in difficulty of handling on CAD.

Accordingly, by transmitting the global clocks with the comparatively low frequency and by synchronizing each local block 330 with a high frequency to be operated like the second semiconductor integrated circuit, a higher speed operation can be realized with the chip size. In addition, since the clock tree is constituted of only the symmetrical oblique lines, there is less delay.

Since each random block 330 is disposed on both sides of the global clock line 312 in the constitution of FIG. 32, the DLL of each random block 330 can be disposed at the end portion of the circuit, and hence a voltage supply is easy.

Figure 33:
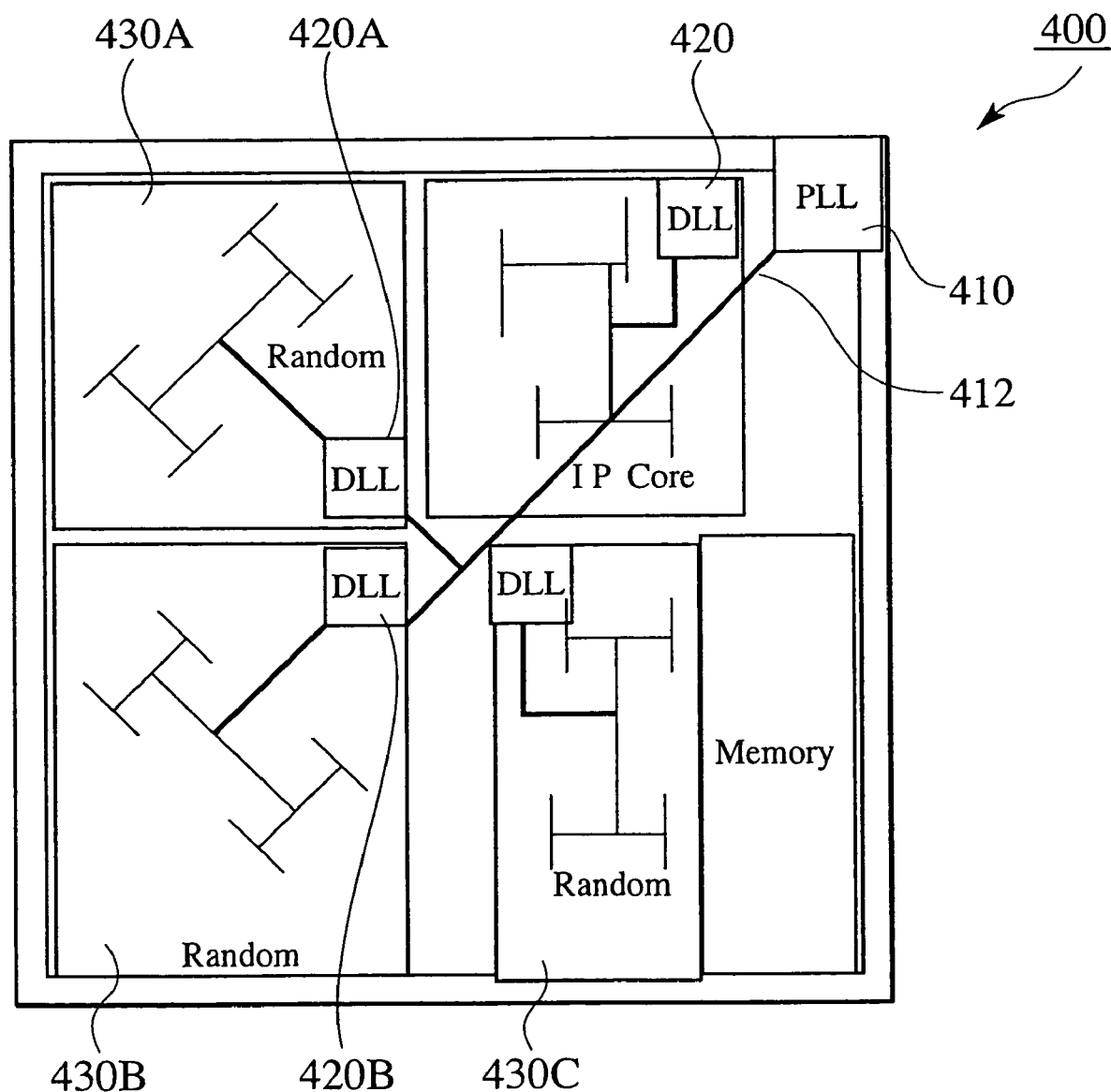
FIG. 33 is a plan view of another example of the second semiconductor integrated circuit shown in FIG. 32

As shown in FIG. 33, in a semiconductor integrated circuit 400, a PLL 410 is disposed at a corner of the circuit, and a global clock line 412 for supplying global clocks lies obliquely. Usually, the global clock line 412 for supplying the global clocks is apt to cause a delay. To remove the delay at this portion and to supply the global clocks to each random block 430 quickly and approximately simultaneously, the global clock line 412 is made to lie obliquely up to the center of the chip, and DLLs 420 of the respective random blocks are disposed collectively at the center portion. Power is supplied to the DLLs 420 from a dedicated area pad (not shown) which is provided on the upper surface of the chip.

By providing the global clock line 412 obliquely, a frequency itself of the global clocks can be raised, and a higher speed operation is possible.

(Example of Third Semiconductor Integrated Circuit)

Figure 34:
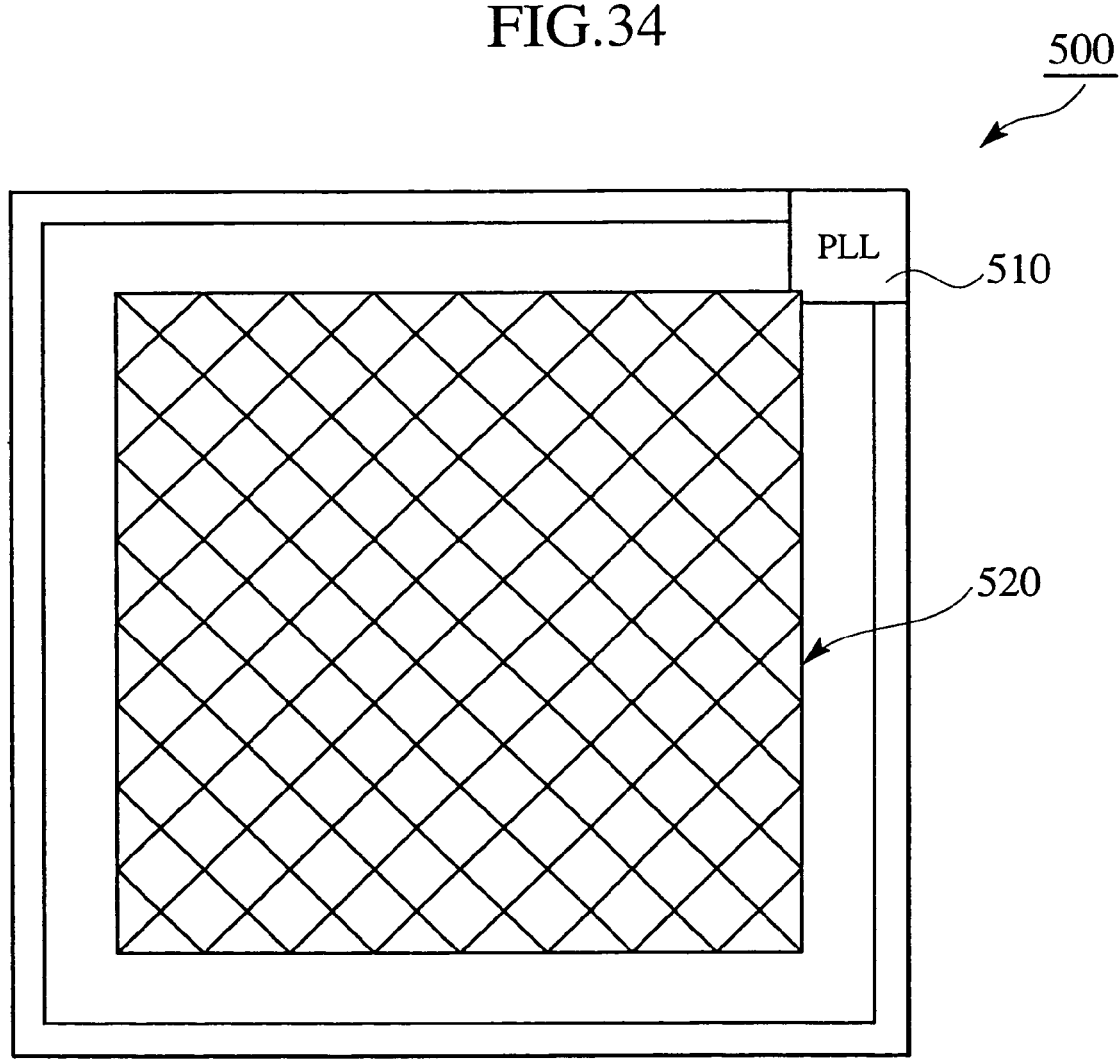
FIG. 34 is a plan view of a third semiconductor integrated circuit having a clock mesh using the oblique line according to the embodiment of the present invention.

As shown in FIG. 34, a third semiconductor integrated circuit 500 comprises a PLL 510 disposed at a corner of a chip, and a clock mesh 520 which is constituted by use of oblique lines and set up approximately all over the chip.

Generally, a clock supply source of a mesh structure is resistant to process variations, and capable of reducing variations owing to a delay on the whole. In the structure shown in FIG. 27, since the clock mesh using the oblique lines is adopted, a delay shortening effect of the clock can be more achieved compared to a mesh using the horizontal and vertical basic orthogonal lines.

Although illustrations are not made, in a lower level of the clock mesh constituted by the oblique lines, a basic orthogonal line level connected directly to the cell is provided. The oblique lines constituting the clock mesh and the basic orthogonal lines provided in the lower level are connected through a via hole based on a terminal layout generated by the foregoing automatic design method.

(Example of Fourth Semiconductor Integrated Circuit)

Figure 35:
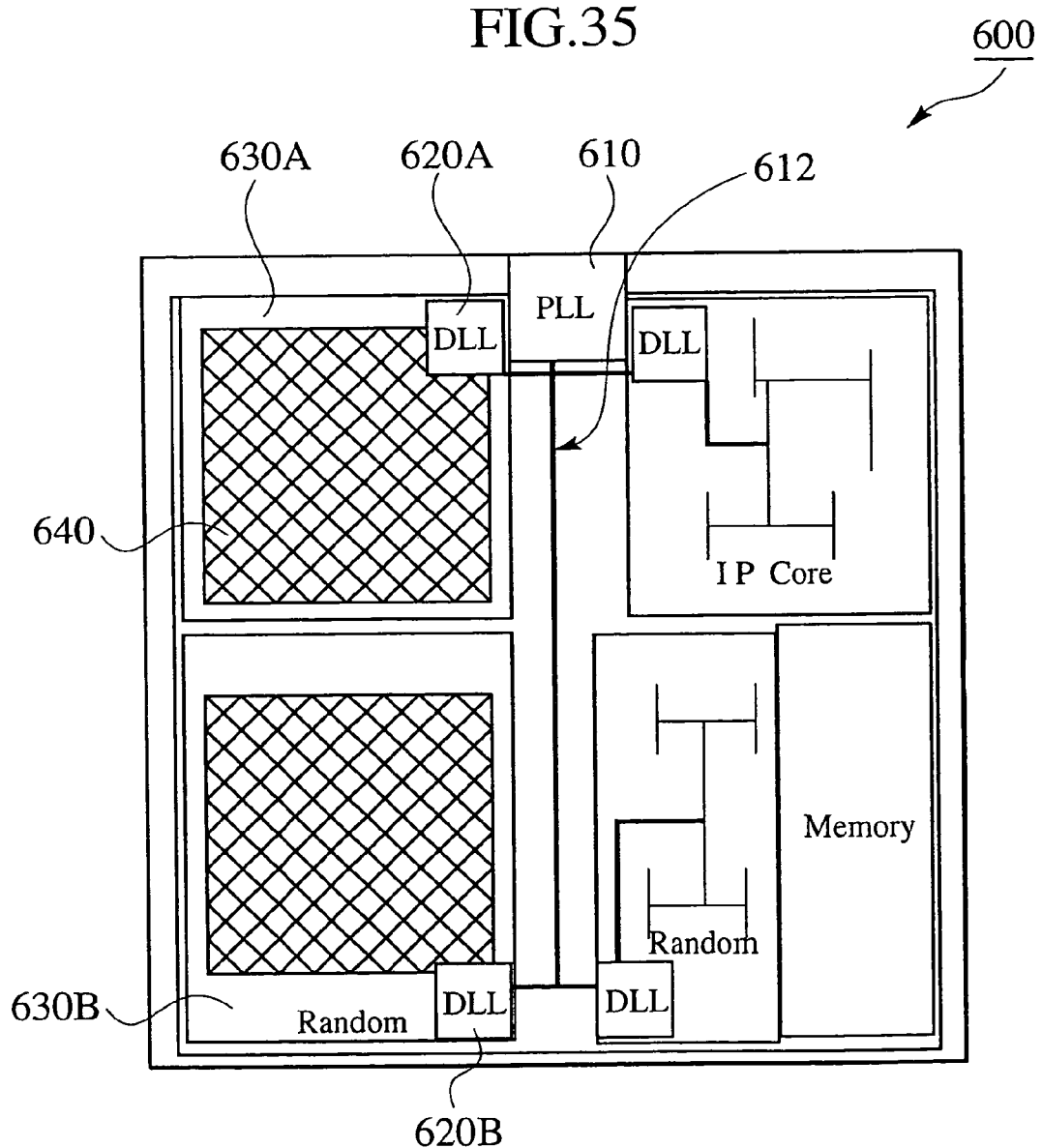
FIG. 35 is a plan view of a fourth semiconductor integrated circuit with a lager scale according to the embodiment of the present invention, and shows an example using the clock mesh of the oblique line shown in FIG. 34 for each block.

As shown in FIG. 35, a fourth semiconductor integrated circuit 600 comprises: a main PLL 610 disposed at an end portion of the circuit, which supplies global clocks of a comparatively low frequency (several hundred MHz); a global clock line 612 extending from the main PLL 610; and a plurality of random blocks 630A and 630B. Each random block 630 comprises a clock driver cell (the DLL in the fourth semiconductor integrated circuit) 620 connected to the global clock line 612; and a clock mesh 640 constituted by oblique lines. Each DLL 620 converts the global clocks of a comparatively low frequency to local clocks of a high frequency (several GHz), and supplies high frequency clocks in the random block through the related clock mesh 640.

Although illustrations are not made, in each random block 630, a basic orthogonal lines connected to the cell are provided in a lower level of the clock mesh 640, the basic orthogonal lines are connected to the upper level through a via hole at a predetermined position based on a terminal layout generated by the foregoing automatic design method.

Each block 630 allows the global clocks sent from the DDL 620 to be synchronized at a high frequency, and supplies a signal to each site through the clock mesh of the oblique lines which hardly show delay variations. Accordingly, a high speed operation of the device can be achieved.

The global clock supply line 612 which lies vertically in FIG. 35 may be allowed to lie obliquely so as to cross the chip as shown in FIG. 33. In this case, the frequency itself of the global clock can be raised, and a higher speed operation is possible.

(Example of Fifth Semiconductor Integrated Circuit)

Figure 36:
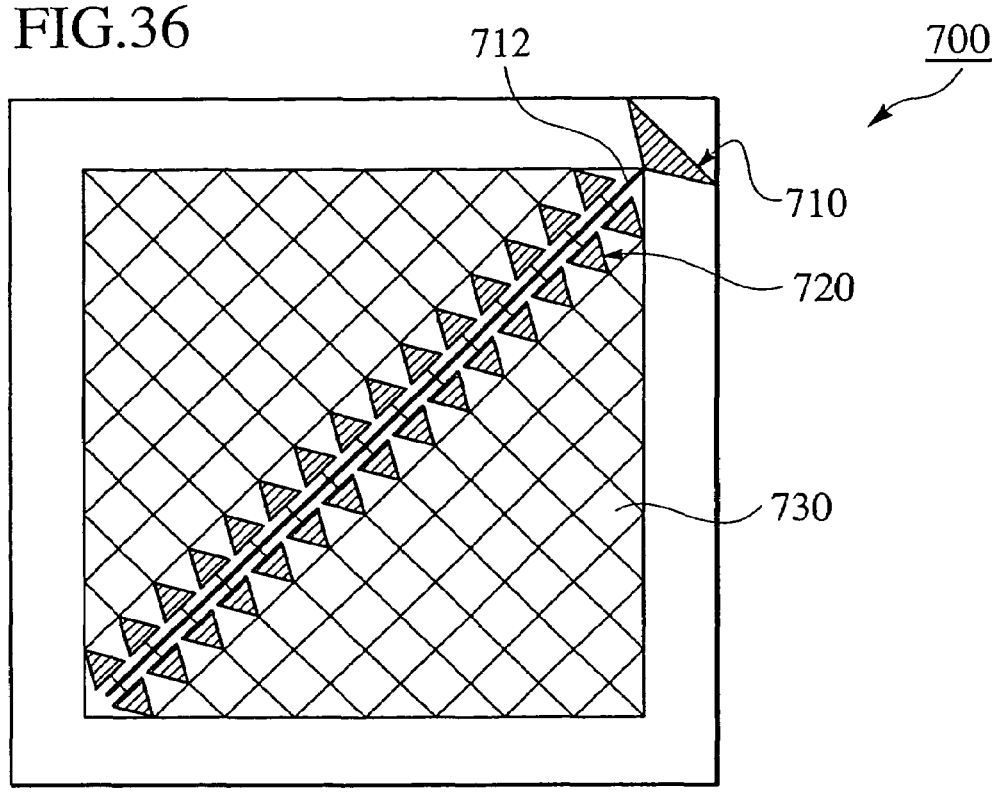
FIG. 36 is a plan view of a fifth semiconductor integrated circuit having a clock mesh using the oblique line structure according to the embodiment of the present invention.

As shown in FIG. 36, a fifth semiconductor integrated circuit 700 has: a route driver 710 disposed at a corner of a chip, which shows a comparatively large driving force; a main clock supply line 712 extending obliquely from the route driver 710 so as to cross the chip; a clock mesh 730 which is set up all over the chip; and a plurality of sub-drivers 720 connected to the main clock supply line 712, which drive oblique lines constituting the clock mesh.

According to the above-described structure, since the oblique lines are driven by the plurality of sub-drivers, it is possible to achieve less delay, and to make a skew of the clock signal small, which is the most serious problem in logic LSI. In addition, there are fewer variations in manufacturing the semiconductor integrated circuit.

(Example of Sixth Semiconductor Integrated Circuit)

Figure 37:
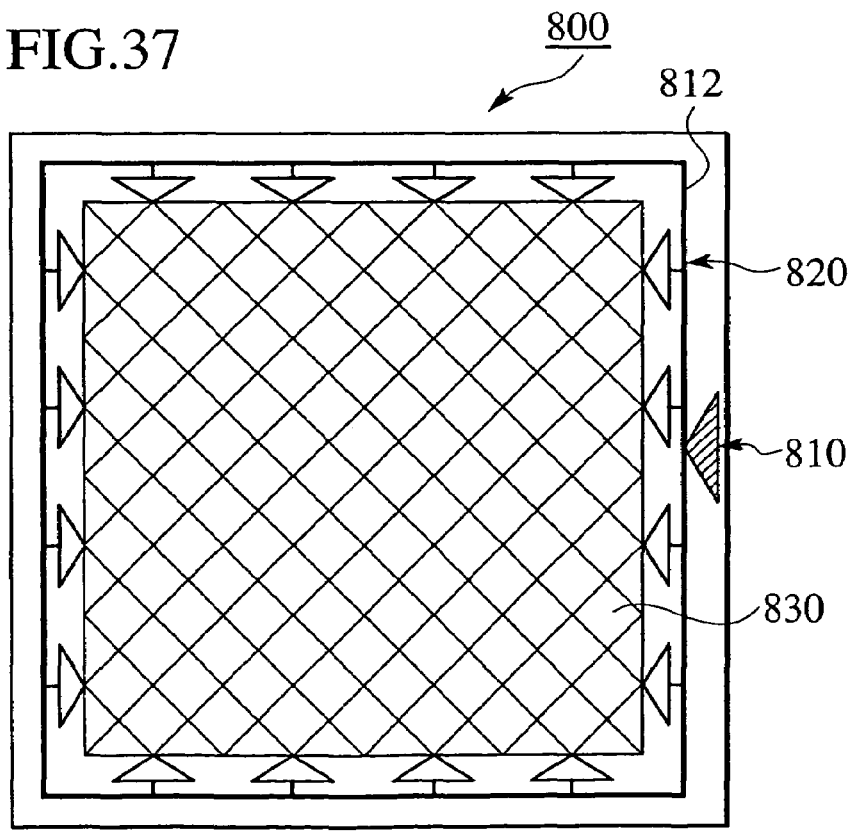
FIG. 37 is a plan view of a sixth semiconductor integrated circuit having a clock mesh using the oblique line structure according to the embodiment of the present invention.

As shown in FIG. 37, a sixth semiconductor integrated circuit 800 has: a route driver 810 disposed at an end portion of a chip, which shows a comparatively large driving force; a main clock supply line 812 extending from the route driver 810 along a periphery of the chip; a clock mesh 830 which is set up all over the chip; and a plurality of sub-drivers 820 connected to the main clock supply line 812, which drive oblique lines constituting the clock mesh.

A feature of the sixth semiconductor integrated circuit 800 is that the sub-drivers 820 are disposed at the periphery of the chip. In the example of FIG. 36, the sub-drivers 620 that may be a noise source are disposed at the center of the chip. In the sixth semiconductor integrated circuit 800, since the noise source is disposed at the periphery of the chip, an effect that a voltage drop hardly occurs is exhibited. When the voltage drop occurs, a difference in performance between the center portion of the chip and the periphery of the chip occurs. The constitution of FIG. 37 is excellent in that uniform performance can be achieved.

(Other Embodiments)

The wire terminating process pattern of the layout design method used in the layout design system of the present invention was described with reference to the examples of the first to ninth embodiments. However, the ones other than the wire terminating process pattern described herein may be adopted. The layout design system of the present invention can select the most suitable wire terminating process pattern from all of the wire terminating process patterns.

In the first to ninth embodiments, though the horizontal line is described as the lower level line and the oblique line is described as the upper level line, the effects of the present invention are unchangeable when these lines are generated inversely thereto. In addition, the principle is the same when the horizontal line is the vertical line. Furthermore, the number of the levels is not limited to two of the horizontal line level and the oblique line level, but the present invention is suitable for an automatic design for three or more levels.

The line structure using various design data described in the first to ninth embodiments can be applied to line structures of various semiconductor integrated circuits.

Moreover, the arrangements of the random blocks in the semiconductor integrated circuit and the positions of the DLLs therein can be set at optional positions as long as the positions are the ones that can be subjected to frequency conversion.

Various modifications will become possible for those skilled in the art after receiving the teachings of the present disclosure without departing from the scope thereof.

What is claimed is:

1. A computer implemented layout design method, comprising:
    generating a first line having a first line width and extending in a predetermined direction;
    generating a second line having a second line width, extending in a direction different from said first line, and having its terminal end overlapping a terminal end of said first line;
    stretching said first line in a longitudinal direction thereof;
    stretching said second line in a longitudinal direction thereof by a length ½ times as long as the second line width;
    deleting a projection from the terminal end of said first line and the terminal end of said second line, the projection protruding from an overlapped area where the terminal end of said first line and the terminal end of said second line overlap; and
    setting a connection pattern having an octagon connecting said first and second lines at an intersection point of a longitudinal center line of said first line and a longitudinal center line of said second line.

2. The layout design method of claim 1, wherein said first and second lines are lines generated in different levels.

3. The layout design method of claim 1, wherein said first and second lines are lines generated in the same level.

4. The layout design method of claim 1, wherein said first and second lines are lines generated in different levels.

5. The layout design method of claim 1, wherein said first and second lines are lines generated in the same level.

6. The layout design method of claim 1, wherein in said stretching said first line in the longitudinal direction thereof, said first line is stretched by a length ½ times as long as the line width of said second line.

7. The layout design method of claim 1, wherein in said stretching said second line in the longitudinal direction thereof, said second line is stretched by a length ½ times as long as the line width of said first line.

8. A manufacturing method of a semiconductor integrated circuit, comprising:
    forming a first line extending in a predetermined direction on a semiconductor substrate;
    forming a level interlayer insulating film on said first line;
    forming an octagonal via hole penetrating through said level interlayer insulating film;
    forming a connection conductive portion filling said an octagonal via hole and connecting with said first line; and
    forming a second line extending at an angle unperpendicularly relative to said first line and having a terminal end connected to said connection conductive portion.

* * * * *